United States Patent
Jin et al.

(10) Patent No.: US 12,146,852 B2
(45) Date of Patent: Nov. 19, 2024

(54) METHODS OF FABRICATING NANOSCALE STRUCTURES USABLE IN MOLECULAR SENSORS AND OTHER DEVICES

(71) Applicant: Roswell Biotechnologies, Inc., San Diego, CA (US)

(72) Inventors: Sungho Jin, San Diego, CA (US); Barry Merriman, San Diego, CA (US); Tim Geiser, San Diego, CA (US); Paul W. Mola, San Diego, CA (US)

( * ) Notice: Subject to any disclaimer, the term of this patent is extended or adjusted under 35 U.S.C. 154(b) by 397 days.

(21) Appl. No.: 17/639,498

(22) PCT Filed: Aug. 18, 2020

(86) PCT No.: PCT/US2020/046792
§ 371 (c)(1),
(2) Date: Mar. 1, 2022

(87) PCT Pub. No.: WO2021/045900
PCT Pub. Date: Mar. 11, 2021

(65) Prior Publication Data
US 2022/0299467 A1    Sep. 22, 2022

Related U.S. Application Data

(60) Provisional application No. 62/896,896, filed on Sep. 6, 2019.

(51) Int. Cl.
*G01N 27/414* (2006.01)
*H01L 21/02* (2006.01)
*H01L 27/146* (2006.01)

(52) U.S. Cl.
CPC .... *G01N 27/4145* (2013.01); *H01L 21/02356* (2013.01); *H01L 27/14698* (2013.01)

(58) Field of Classification Search
CPC .............. G01N 27/4145; H01L 21/205; H01L 21/02356; H01L 27/14698
See application file for complete search history.

(56) References Cited

U.S. PATENT DOCUMENTS

| | | | |
|---|---|---|---|
| 4,923,586 A | 5/1990 | Katayama et al. |
| 5,082,627 A | 1/1992 | Stanbro |
| 5,194,133 A | 3/1993 | Clark et al. |
| 5,366,140 A | 11/1994 | Koskenmaki et al. |
| 5,414,588 A | 5/1995 | Barbee, Jr. et al. |
| 5,486,449 A | 1/1996 | Hosono et al. |
| 5,532,128 A | 7/1996 | Eggers et al. |

(Continued)

OTHER PUBLICATIONS

International Search Report issued on Nov. 4, 2020 for PCT/US2020/046792.

*Primary Examiner* — David Vu
*Assistant Examiner* — Brandon C Fox

(57) ABSTRACT

A structure usable in a molecular sensor device comprises a substrate defining a substrate plane and spaced apart pairs of reducible metal oxide or metal nitride sheets attached to the substrate at an angle to the substrate plane. The structure further includes intervening dielectric sheets. Fabrication methods for manufacturing structures for molecular sensors are disclosed comprising oblique angle deposition of reducible metal oxide or metal nitride and dielectric layers, planarization of the resulting stack, and reduction of portions of the reducible metal oxide or metal nitride sheets to the corresponding base metal.

20 Claims, 10 Drawing Sheets

(56) References Cited

U.S. PATENT DOCUMENTS

| | | |
|---|---|---|
| 5,583,359 A | 12/1996 | Ng et al. |
| 5,639,507 A | 6/1997 | Galvagni |
| 5,646,420 A | 7/1997 | Yamashita |
| 5,767,687 A | 6/1998 | Geist |
| 5,871,918 A | 2/1999 | Thorp et al. |
| 5,881,184 A | 3/1999 | Guidash |
| 5,965,452 A | 10/1999 | Kovacs |
| 5,982,018 A | 11/1999 | Wark et al. |
| 6,051,380 A | 4/2000 | Sosnowski et al. |
| 6,060,023 A | 5/2000 | Maracas |
| 6,094,335 A | 7/2000 | Early |
| 6,110,354 A | 8/2000 | Saban et al. |
| 6,123,819 A | 9/2000 | Peeters |
| 6,144,023 A | 11/2000 | Clerc |
| 6,238,927 B1 | 5/2001 | Abrams et al. |
| 6,440,662 B1 | 8/2002 | Gerwen et al. |
| 6,464,889 B1 | 10/2002 | Lee et al. |
| 6,506,564 B1 | 1/2003 | Mirkin et al. |
| 6,537,747 B1 | 3/2003 | Mills, Jr. et al. |
| 6,670,131 B2 | 12/2003 | Hashimoto |
| 6,673,533 B1 | 1/2004 | Wohlstadter et al. |
| 6,716,620 B2 | 4/2004 | Bashir et al. |
| 6,749,731 B2 | 6/2004 | Kobori et al. |
| 6,762,050 B2 | 7/2004 | Fukushima et al. |
| 6,764,745 B1 | 7/2004 | Karasawa et al. |
| 6,790,341 B1 | 9/2004 | Saban et al. |
| 6,824,974 B2 | 11/2004 | Pisharody et al. |
| 6,861,224 B2 | 3/2005 | Fujita et al. |
| 6,916,614 B1 | 7/2005 | Takenaka et al. |
| 6,958,216 B2 | 10/2005 | Kelley et al. |
| 7,015,046 B2 | 3/2006 | Wohlstadter et al. |
| 7,075,428 B1 | 7/2006 | Oleynik |
| 7,169,272 B2 | 1/2007 | Fritsch et al. |
| 7,183,055 B2 | 2/2007 | Weide et al. |
| 7,189,435 B2 | 3/2007 | Tuominen et al. |
| 7,202,480 B2 | 4/2007 | Yokoi et al. |
| 7,208,077 B1 | 4/2007 | Albers et al. |
| 7,276,206 B2 | 10/2007 | Augustine et al. |
| 7,399,585 B2 | 7/2008 | Gau |
| 7,432,120 B2 | 10/2008 | Mascolo et al. |
| 7,470,533 B2 | 12/2008 | Xu et al. |
| 7,507,320 B2 | 3/2009 | Hwang et al. |
| 7,531,120 B2 | 5/2009 | Rijn et al. |
| 7,579,823 B1 | 8/2009 | Ayliffe |
| 7,691,433 B2 | 4/2010 | Kronholz et al. |
| 7,785,785 B2 | 8/2010 | Pourmand et al. |
| 7,834,344 B2 | 11/2010 | Mascolo et al. |
| 7,851,045 B2 | 12/2010 | Gandon et al. |
| 7,886,601 B2 | 2/2011 | Merassi et al. |
| 7,901,629 B2 | 3/2011 | Calatzis et al. |
| 7,943,394 B2 | 5/2011 | Flandre et al. |
| 8,241,508 B2 | 8/2012 | D'urso et al. |
| 8,313,633 B2 | 11/2012 | Li et al. |
| 8,351,181 B1 | 1/2013 | Ahn et al. |
| 8,591,816 B2 | 11/2013 | Calatzis et al. |
| 8,652,768 B1 | 2/2014 | Huber et al. |
| 8,753,893 B2 | 6/2014 | Liu et al. |
| 8,927,464 B2 | 1/2015 | Aizenberg et al. |
| 8,940,663 B2 | 1/2015 | Iqbal et al. |
| 9,070,733 B2 | 6/2015 | Rajagopal et al. |
| 9,108,880 B2 | 8/2015 | Jin et al. |
| 9,139,614 B2 | 9/2015 | Medintz et al. |
| 9,306,164 B1 | 4/2016 | Chang et al. |
| 9,829,456 B1 | 11/2017 | Jin et al. |
| 9,956,743 B2 | 5/2018 | Jin et al. |
| 10,036,064 B2 | 7/2018 | Merriman et al. |
| 10,125,420 B2 | 11/2018 | Jin et al. |
| 10,151,722 B2 | 12/2018 | Jin et al. |
| 10,508,296 B2 | 12/2019 | Merriman et al. |
| 10,526,696 B2 | 1/2020 | Jin et al. |
| 10,584,410 B2 | 3/2020 | Jin et al. |
| 10,597,767 B2 | 3/2020 | Merriman et al. |
| 10,648,941 B2 | 5/2020 | Merriman et al. |
| 10,712,334 B2 | 7/2020 | Choi et al. |
| 2002/0016306 A1 | 2/2002 | Hutchison et al. |
| 2002/0022223 A1 | 2/2002 | Connolly |
| 2002/0090649 A1 | 7/2002 | Chan et al. |
| 2002/0098500 A1 | 7/2002 | Saraf et al. |
| 2002/0119572 A1 | 8/2002 | Jacobson et al. |
| 2002/0137083 A1 | 9/2002 | Kobori et al. |
| 2002/0138049 A1 | 9/2002 | Allen et al. |
| 2002/0142150 A1 | 10/2002 | Baumann et al. |
| 2002/0142477 A1 | 10/2002 | Lewis et al. |
| 2002/0168667 A1 | 11/2002 | Kinoshita et al. |
| 2002/0172963 A1 | 11/2002 | Kelley et al. |
| 2002/0184939 A1 | 12/2002 | Yadav et al. |
| 2003/0025133 A1 | 2/2003 | Brousseau |
| 2003/0040173 A1 | 2/2003 | Fonash et al. |
| 2003/0064390 A1 | 4/2003 | Schülein et al. |
| 2003/0087296 A1 | 5/2003 | Fujita et al. |
| 2003/0109031 A1 | 6/2003 | Chafin et al. |
| 2003/0141189 A1 | 7/2003 | Lee et al. |
| 2003/0141276 A1 | 7/2003 | Lee |
| 2003/0186263 A1 | 10/2003 | Frey et al. |
| 2003/0224387 A1 | 12/2003 | Kunwar et al. |
| 2004/0012161 A1 | 1/2004 | Chiu |
| 2004/0014106 A1 | 1/2004 | Patno et al. |
| 2004/0023253 A1 | 2/2004 | Kunwar et al. |
| 2004/0038090 A1 | 2/2004 | Faris |
| 2004/0048241 A1 | 3/2004 | Freeman et al. |
| 2004/0063100 A1 | 4/2004 | Wang |
| 2004/0086929 A1 | 5/2004 | Weide et al. |
| 2004/0096866 A1 | 5/2004 | Hofmann et al. |
| 2004/0146863 A1 | 7/2004 | Pisharody et al. |
| 2004/0209355 A1 | 10/2004 | Edman et al. |
| 2004/0209435 A1 | 10/2004 | Partridge et al. |
| 2004/0229247 A1 | 11/2004 | DeBoer et al. |
| 2004/0235016 A1 | 11/2004 | Hamers et al. |
| 2004/0248282 A1 | 12/2004 | M. et al. |
| 2005/0029227 A1 | 2/2005 | Chapman |
| 2005/0067086 A1 | 3/2005 | Ito et al. |
| 2005/0074911 A1 | 4/2005 | Kornilovich et al. |
| 2005/0151541 A1 | 7/2005 | Brinz et al. |
| 2005/0156157 A1 | 7/2005 | Parsons et al. |
| 2005/0164371 A1 | 7/2005 | Arinaga |
| 2005/0172199 A1 | 8/2005 | Miller et al. |
| 2005/0181195 A1 | 8/2005 | Dubrow |
| 2005/0221473 A1 | 10/2005 | Dubin et al. |
| 2005/0227373 A1 | 10/2005 | Flandre et al. |
| 2005/0247573 A1 | 11/2005 | Nakamura et al. |
| 2005/0285275 A1 | 12/2005 | Son et al. |
| 2005/0287548 A1 | 12/2005 | Bao et al. |
| 2005/0287589 A1 | 12/2005 | Connolly |
| 2006/0003482 A1 | 1/2006 | Chinthakindi et al. |
| 2006/0019273 A1 | 1/2006 | Connolly et al. |
| 2006/0024504 A1 | 2/2006 | Nelson et al. |
| 2006/0024508 A1 | 2/2006 | D'Urso et al. |
| 2006/0029808 A1 | 2/2006 | Zhai et al. |
| 2006/0051919 A1 | 3/2006 | Mascolo et al. |
| 2006/0051946 A1 | 3/2006 | Mascolo et al. |
| 2006/0105449 A1 | 5/2006 | Larmer et al. |
| 2006/0105467 A1 | 5/2006 | Niksa et al. |
| 2006/0128239 A1 | 6/2006 | Nun et al. |
| 2006/0147983 A1 | 7/2006 | O'Uchi |
| 2006/0154489 A1 | 7/2006 | Tornow et al. |
| 2006/0275853 A1 | 12/2006 | Mathew et al. |
| 2007/0026193 A1 | 2/2007 | Luzinov et al. |
| 2007/0048748 A1 | 3/2007 | Williams et al. |
| 2007/0140902 A1 | 6/2007 | Calatzis et al. |
| 2007/0148815 A1 | 6/2007 | Chao et al. |
| 2007/0184247 A1 | 8/2007 | Simpson et al. |
| 2007/0186628 A1 | 8/2007 | Curry et al. |
| 2007/0207487 A1 | 9/2007 | Emig et al. |
| 2007/0231542 A1 | 10/2007 | Deng et al. |
| 2008/0012007 A1 | 1/2008 | Li et al. |
| 2008/0098815 A1 | 5/2008 | Merassi et al. |
| 2008/0149479 A1 | 6/2008 | Olofsson et al. |
| 2008/0199657 A1 | 8/2008 | Capron et al. |
| 2008/0199659 A1 | 8/2008 | Zhao |
| 2009/0006284 A1 | 1/2009 | Liu et al. |
| 2009/0011222 A1 | 1/2009 | Xiu et al. |
| 2009/0017571 A1 | 1/2009 | Nuckolls et al. |
| 2009/0020428 A1 | 1/2009 | Levitan et al. |
| 2009/0027036 A1 | 1/2009 | Nuckolls et al. |

(56) References Cited

U.S. PATENT DOCUMENTS

| | | |
|---|---|---|
| 2009/0152109 A1 | 6/2009 | Whitehead et al. |
| 2009/0162927 A1 | 6/2009 | Naaman et al. |
| 2009/0170716 A1 | 7/2009 | Su et al. |
| 2009/0178935 A1 | 7/2009 | Reymond et al. |
| 2009/0295372 A1 | 12/2009 | Krstic et al. |
| 2009/0297913 A1 | 12/2009 | Zhang et al. |
| 2009/0305432 A1 | 12/2009 | Liotta et al. |
| 2009/0306578 A1 | 12/2009 | Sivan et al. |
| 2009/0324308 A1 | 12/2009 | Law et al. |
| 2010/0038342 A1 | 2/2010 | Lim et al. |
| 2010/0044212 A1 | 2/2010 | Kim et al. |
| 2010/0055397 A1 | 3/2010 | Kurihara et al. |
| 2010/0101956 A1 | 4/2010 | Choi et al. |
| 2010/0132771 A1 | 6/2010 | Lu |
| 2010/0142259 A1 | 6/2010 | Drndic et al. |
| 2010/0149530 A1 | 6/2010 | Tomaru |
| 2010/0167938 A1 | 7/2010 | Su et al. |
| 2010/0184062 A1 | 7/2010 | Steinmüller-Nethl et al. |
| 2010/0188109 A1 | 7/2010 | Edel et al. |
| 2010/0194409 A1 | 8/2010 | Gao et al. |
| 2010/0201381 A1 | 8/2010 | Iqbal et al. |
| 2010/0206367 A1 | 8/2010 | Jeong et al. |
| 2010/0227416 A1 | 9/2010 | Koh et al. |
| 2010/0280397 A1 | 11/2010 | Feldman et al. |
| 2010/0285275 A1 | 11/2010 | Baca et al. |
| 2010/0285601 A1 | 11/2010 | Kong et al. |
| 2010/0288543 A1 | 11/2010 | Hung et al. |
| 2010/0300899 A1 | 12/2010 | Levine et al. |
| 2011/0056845 A1 | 3/2011 | Stellacci et al. |
| 2011/0065588 A1 | 3/2011 | Su et al. |
| 2011/0076783 A1 | 3/2011 | Liu et al. |
| 2011/0091787 A1 | 4/2011 | McGrath et al. |
| 2011/0160077 A1 | 6/2011 | Chaisson et al. |
| 2011/0166034 A1 | 7/2011 | Kwong et al. |
| 2011/0217763 A1 | 9/2011 | Rasooly et al. |
| 2011/0223065 A1 | 9/2011 | Kim et al. |
| 2011/0224091 A1 | 9/2011 | Panchapakesan |
| 2011/0227558 A1 | 9/2011 | Mannion et al. |
| 2011/0229667 A1 | 9/2011 | Jin et al. |
| 2011/0233075 A1 | 9/2011 | Soleymani et al. |
| 2011/0248315 A1 | 10/2011 | Nam et al. |
| 2011/0287956 A1 | 11/2011 | Iqbal et al. |
| 2011/0291673 A1 | 12/2011 | Shibata et al. |
| 2011/0311853 A1 | 12/2011 | Fratti |
| 2011/0312529 A1 | 12/2011 | He et al. |
| 2012/0060905 A1 | 3/2012 | Fogel et al. |
| 2012/0122715 A1 | 5/2012 | Gao et al. |
| 2012/0220046 A1 | 8/2012 | Chao |
| 2012/0258870 A1 | 10/2012 | Schwartz et al. |
| 2012/0286332 A1 | 11/2012 | Rothberg et al. |
| 2012/0309106 A1 | 12/2012 | Eichen et al. |
| 2013/0049158 A1 | 2/2013 | Hong et al. |
| 2013/0071289 A1 | 3/2013 | Knoll |
| 2013/0108956 A1 | 5/2013 | Lu et al. |
| 2013/0109577 A1 | 5/2013 | Korlach et al. |
| 2013/0162276 A1 | 6/2013 | Lee et al. |
| 2013/0183492 A1 | 7/2013 | Lee et al. |
| 2013/0214875 A1 | 8/2013 | Duncan et al. |
| 2013/0239349 A1 | 9/2013 | Knights et al. |
| 2013/0245416 A1 | 9/2013 | Yarmush et al. |
| 2013/0273340 A1 | 10/2013 | Neretina et al. |
| 2013/0281325 A1 | 10/2013 | Elibol et al. |
| 2013/0331299 A1 | 12/2013 | Reda et al. |
| 2014/0001055 A1 | 1/2014 | Elibol et al. |
| 2014/0011013 A1 | 1/2014 | Jin et al. |
| 2014/0018262 A1 | 1/2014 | Reda et al. |
| 2014/0027775 A1 | 1/2014 | Quick et al. |
| 2014/0048776 A1 | 2/2014 | Huang et al. |
| 2014/0054788 A1 | 2/2014 | Majima et al. |
| 2014/0057283 A1 | 2/2014 | Wang et al. |
| 2014/0061049 A1 | 3/2014 | Lo et al. |
| 2014/0079592 A1 | 3/2014 | Chang et al. |
| 2014/0170567 A1 | 6/2014 | Sakamoto et al. |
| 2014/0174927 A1 | 6/2014 | Bashir et al. |
| 2014/0197459 A1 | 7/2014 | Kis et al. |
| 2014/0218637 A1 | 8/2014 | Gao et al. |
| 2014/0235493 A1 | 8/2014 | Zang et al. |
| 2014/0253827 A1 | 9/2014 | Gao et al. |
| 2014/0284667 A1 | 9/2014 | Basker et al. |
| 2014/0320849 A1 | 10/2014 | Chou et al. |
| 2014/0367749 A1 | 12/2014 | Bai et al. |
| 2014/0377900 A1 | 12/2014 | Astier et al. |
| 2015/0005188 A1 | 1/2015 | Levner et al. |
| 2015/0006089 A1 | 1/2015 | Pagels |
| 2015/0017655 A1 | 1/2015 | Huang et al. |
| 2015/0049332 A1 | 2/2015 | Sun et al. |
| 2015/0057182 A1 | 2/2015 | Merriman et al. |
| 2015/0065353 A1 | 3/2015 | Turner et al. |
| 2015/0068892 A1 | 3/2015 | Ueno et al. |
| 2015/0077183 A1 | 3/2015 | Ciubotaru |
| 2015/0132835 A1 | 5/2015 | Pagels et al. |
| 2015/0148264 A1 | 5/2015 | Esfandyarpour et al. |
| 2015/0177150 A1 | 6/2015 | Rothberg et al. |
| 2015/0191709 A1 | 7/2015 | Heron et al. |
| 2015/0263203 A1 | 9/2015 | Lewis et al. |
| 2015/0268186 A1 | 9/2015 | Pagels |
| 2015/0294875 A1 | 10/2015 | Khondaker et al. |
| 2015/0344945 A1 | 12/2015 | Mandell et al. |
| 2016/0017416 A1 | 1/2016 | Boyanov et al. |
| 2016/0155971 A1 | 6/2016 | Strachan et al. |
| 2016/0187282 A1 | 6/2016 | Gardner et al. |
| 2016/0265047 A1 | 9/2016 | Rooyen et al. |
| 2016/0284811 A1 | 9/2016 | Yu et al. |
| 2016/0290957 A1 | 10/2016 | Ram et al. |
| 2016/0319342 A1 | 11/2016 | Kawai et al. |
| 2016/0377564 A1 | 12/2016 | Carmignani et al. |
| 2017/0023512 A1 | 1/2017 | Cummins et al. |
| 2017/0037462 A1 | 2/2017 | Turner et al. |
| 2017/0038333 A1 | 2/2017 | Turner et al. |
| 2017/0043355 A1 | 2/2017 | Fischer |
| 2017/0044605 A1 | 2/2017 | Merriman et al. |
| 2017/0131237 A1 | 5/2017 | Ikeda |
| 2017/0184542 A1 | 6/2017 | Chatelier et al. |
| 2017/0234825 A1 | 8/2017 | Elibol et al. |
| 2017/0240962 A1 | 8/2017 | Merriman et al. |
| 2017/0288017 A1 | 10/2017 | Majima et al. |
| 2017/0332918 A1 | 11/2017 | Keane |
| 2018/0014786 A1 | 1/2018 | Keane |
| 2018/0030601 A1 | 2/2018 | Naaman et al. |
| 2018/0031508 A1 | 2/2018 | Jin et al. |
| 2018/0031509 A1 | 2/2018 | Jin et al. |
| 2018/0038815 A1 | 2/2018 | Gu et al. |
| 2018/0045665 A1 | 2/2018 | Jin et al. |
| 2018/0297321 A1 | 10/2018 | Jin et al. |
| 2018/0305727 A1 | 10/2018 | Merriman et al. |
| 2018/0340220 A1 | 11/2018 | Merriman et al. |
| 2019/0004003 A1 | 1/2019 | Merriman et al. |
| 2019/0033244 A1 | 1/2019 | Jin et al. |
| 2019/0039065 A1 | 2/2019 | Choi et al. |
| 2019/0041355 A1 | 2/2019 | Merriman et al. |
| 2019/0041378 A1 | 2/2019 | Choi et al. |
| 2019/0094175 A1 | 3/2019 | Merriman et al. |
| 2019/0194801 A1 | 6/2019 | Jin et al. |
| 2019/0355442 A1 | 11/2019 | Merriman et al. |
| 2019/0376925 A1 | 12/2019 | Choi et al. |
| 2019/0383770 A1 | 12/2019 | Choi et al. |
| 2020/0157595 A1 | 5/2020 | Merriman et al. |
| 2020/0217813 A1 | 7/2020 | Merriman et al. |
| 2020/0242482 A1 | 7/2020 | Merriman et al. |
| 2020/0277645 A1 | 9/2020 | Merriman et al. |
| 2020/0385850 A1 | 12/2020 | Merriman et al. |
| 2020/0385855 A1 | 12/2020 | Jin et al. |
| 2020/0393440 A1 | 12/2020 | Jin et al. |

METHODS OF FABRICATING NANOSCALE STRUCTURES USABLE IN MOLECULAR SENSORS AND OTHER DEVICES

CROSS-REFERENCE TO RELATED APPLICATIONS

This application is a National Phase of and claims priority to PCT/US2020/046792 filed Aug. 18, 2020, which claims priority to and the benefit of U.S. Provisional Patent Application Ser. No. 62/896,896 filed Sep. 6, 2019 and entitled "Methods of Fabricating Nanoscale Structures Usable in Molecular Sensors and Other Devices," the disclosures of which are incorporated herein by reference in their entireties.

FIELD

The present disclosure generally relates to nanofabrication and nanoelectronics, and more particularly relates to device structures and the fabrication of structures usable in molecular sensors for sensing and analyzing molecules.

BACKGROUND

Molecular analysis has received an increasing amount of attention in various fields such as precision medicine or nanotechnology. One example includes the analysis of molecules for sequencing genomes. The seminal work of Avery in 1946 demonstrated that DNA was the material that determined traits of an organism. The molecular structure of DNA was then first described by Watson and Crick in 1953, for which they received the 1962 Nobel Prize in Medicine. This work made it clear that the sequence of chemical letters (bases) of the DNA molecules encode the fundamental biological information. Since this discovery, there has been a concerted effort to develop means to actually experimentally measure this sequence. The first method for systematically sequencing DNA was introduced by Sanger in 1978, for which he received the 1980 Nobel Prize in Chemistry.

A basic method for sequencing a genome was automated in a commercial instrument platform in the late 1980's, which ultimately enabled the sequencing of the first human genome in 2001. This was the result of a massive public and private effort taking over a decade, at a cost of billions of dollars, and relying on the output of thousands of dedicated DNA sequencing instruments. The success of this effort motivated the development of a number of "massively parallel" sequencing platforms with the goal of dramatically reducing the cost and time required to sequence a human genome. Such massively parallel sequencing platforms generally rely on processing millions to billions of sequencing reactions at the same time in highly miniaturized microfluidic formats. The first of these was invented and commercialized by Rothberg in 2005 as the 454 platform, which achieved thousand fold reductions in cost and instrument time. However, the 454 platform still required approximately a million dollars and took over a month to sequence a genome.

Further improvements in quality and accuracy of sequencing, as well as reductions in cost and time are still needed. This is especially true to make genome sequencing practical for widespread use in precision medicine, where it is desirable to sequence the genomes of millions of individuals with a clinical grade of quality.

While many DNA sequencing techniques utilize optical means with fluorescence reporters, such methods can be cumbersome, slow in detection speed, and difficult to mass produce to further reduce costs. Label-free DNA or genome sequencing approaches provide advantages of not having to use fluorescent type labeling processes and associated optical systems, especially when combined with electronic signal detection that can be achieved rapidly and in an inexpensive way.

In this regard, certain types of molecular electronic devices can detect single molecule, biomolecular analytes such as DNAs, RNAs, proteins, and nucleotides by measuring electronic signal changes when the analyte molecule is attached to a circuit. Such methods are label-free and thus avoid using complicated, bulky and expensive fluorescent type labeling apparatus While current molecular electronic devices can electronically measure molecules for various applications, they lack the scalability and manufacturability needed for rapidly sensing many analytes at a scale of up to millions in a practical manner. Such highly scalable methods are particularly important for DNA sequencing applications, which often need to analyze millions to billions of independent DNA molecules. In addition, the manufacture of current molecular electronic devices is generally costly due to the high level of precision needed.

Thus, new and improved structures e.g., device stacks, and methods of fabricating new structures are needed to lower cost and improve performance of molecular sensors comprising structure assemblies.

SUMMARY

In various embodiments of the present disclosure, new structures such as device stacks, and methods of fabrication of structures usable in molecular sensors are described.

In various aspects of the present disclosure, a method of manufacturing a structure usable in a molecular sensor device is disclosed. The method comprises: providing a substrate defining a substrate plane with a protrusion protruding from the substrate at an angle to the substrate plane; depositing a first reducible metal oxide or metal nitride layer in an orientation along a side of the protrusion to form a first reducible metal oxide or metal nitride sheet at the angle to the substrate plane; depositing an inner dielectric layer on the first reducible metal oxide or metal nitride layer to form an inner dielectric sheet at the angle to the substrate plane; depositing a second reducible metal oxide or metal nitride layer on the inner dielectric layer to form a second reducible metal oxide or metal nitride sheet at the angle to the substrate plane, wherein the first reducible metal oxide or metal nitride sheet and the second reducible metal oxide or metal nitride sheet form a pair of sheets spaced apart by the inner dielectric sheet between the first reducible metal oxide or metal nitride sheet and the second reducible metal oxide or metal nitride sheet; depositing an outer dielectric layer on the second reducible metal oxide or metal nitride layer to form an outer dielectric sheet at an angle to the substrate plane; repeating the depositing of the first reducible metal oxide or metal nitride layer, the inner dielectric layer, the second reducible metal oxide or metal nitride layer, and the outer dielectric layer at least once to form spaced apart pairs of reducible metal oxide or metal nitride sheets with an inner dielectric sheet between each reducible metal oxide or metal nitride sheet in the pair of reducible metal oxide or metal nitride sheets and an outer dielectric sheet between each pair of reducible metal oxide or metal nitride sheets; planarizing the pairs of reducible metal oxide or metal nitride sheets, the inner dielectric sheets, and the outer dielectric sheets to form exposed end portions of each; and reducing the exposed end portions of the reducible metal oxide or metal nitride sheets to the corresponding metal to form parallel metal electrode strips.

In various aspects, each inner dielectric layer is deposited with a first thickness, each outer dielectric sheet is deposited with a second thickness, and the second thickness is at least one order of magnitude greater than the first thickness.

In certain aspects the method may further comprise attaching a mechanically supportive block material adjacent a stack formed by the deposited first reducible metal oxide or metal nitride layers, inner dielectric layers, second reducible metal oxide or metal nitride layers, and outer dielectric layers, prior to the step of planarizing.

In various embodiments, the inner dielectric sheets and the outer dielectric sheets may comprise different dielectric materials. Reducing the exposed end portions of the reducible metal oxide or metal nitride sheets to the corresponding metal may comprise exposure to $H_2$.

In certain aspects, the method may further comprise (i) placing at least one portion of a dielectric mask layer across the metal electrode strips to leave short segments of electrode strips exposed in a gap; and (ii) depositing metal islands on the short segments of electrode strips. The gap may measure from about 2 nm to about 40 nm.

In various aspects of the method, a plurality of lead conductors may be connected to metal electrode strips with each lead conductor connected to a respective electrode strip, wherein each lead conductor diverges in width as the lead conductor extends away from an edge of the electrode strip. The method may further comprise depositing a gate electrode parallel to the substrate plane and perpendicular to a reducible metal oxide or metal nitride plane defined by a reducible metal oxide or metal nitride sheet in the spaced apart pairs of reducible metal oxide or metal nitride sheets.

In various embodiments of the present disclosure, a method of manufacturing a structure usable in a molecular sensor device is disclosed. The method comprises: providing a substrate defining a substrate plane with a protrusion protruding from the substrate at an angle to the substrate plane; depositing a first reducible metal oxide or metal nitride layer in an orientation along a side of the protrusion to form a first reducible metal oxide or metal nitride sheet at the angle to the substrate plane; depositing an inner dielectric layer on the first reducible metal oxide or metal nitride layer to form an inner dielectric sheet at the angle to the substrate plane; depositing a second reducible metal oxide or metal nitride layer on the inner dielectric layer to form a second reducible metal oxide or metal nitride sheet at the angle to the substrate plane, wherein the first reducible metal oxide or metal nitride sheet and the second reducible metal oxide or metal nitride sheet form a pair of sheets spaced apart by the inner dielectric sheet between the first reducible metal oxide or metal nitride sheet and the second reducible metal oxide or metal nitride sheet; depositing an outer dielectric layer on the second reducible metal oxide or metal nitride layer to form an outer dielectric sheet at an angle to the substrate plane; repeating the depositing of the first reducible metal oxide or metal nitride layer, the inner dielectric layer, the second reducible metal oxide or metal nitride layer, and the outer dielectric layer at least once to form spaced apart pairs of reducible metal oxide or metal nitride sheets with an inner dielectric sheet between each reducible metal oxide or metal nitride sheet in the pair of reducible metal oxide or metal nitride sheets and an outer dielectric sheet between each pair of reducible metal oxide or metal nitride sheets; planarizing the pairs of reducible metal oxide or metal nitride sheets, the inner dielectric sheets, and the outer dielectric sheets to form exposed end portions of each; selectively etching an exposed end portion of each inner dielectric sheet to form grooves in each inner dielectric sheet descending from the planarized edge toward the substrate; filling the grooves with PMMA-type resist material; depositing a metal layer on the planarized surface of the structure; and removing the PMMA-type resist material along with deposited metal residing thereon leaving an arrangement of pairs of spaced apart parallel metal electrode strips with the metal electrode strips in a pair of strips separated by a groove.

In various aspects, the method may further comprise attaching a mechanically supportive block material adjacent a stack formed by the deposited first reducible metal oxide or metal nitride layers, inner dielectric layers, second reducible metal oxide or metal nitride layers, and outer dielectric layers, prior to the step of planarizing. In other aspects, the inner dielectric sheets and the outer dielectric sheets may comprise different dielectric materials.

In certain embodiments, the inner dielectric layer has a first thickness, the outer dielectric layer has a second thickness, and the second thickness is at least one order of magnitude greater than the first thickness.

In various aspects, the method may further comprise: (i) placing at least one portion of a dielectric mask layer across the metal electrode strips to leave short segments of electrode strips exposed in a gap; and (ii) depositing metal islands on the short segments of electrode strips. The gap may measure from about 2 nm to about 40 nm.

In various embodiments, a structure usable in a molecular sensor device is disclosed. The structure comprises: a substrate defining a substrate plane; spaced apart pairs of reducible metal oxide or metal nitride layer sheets attached on an edge of the reducible metal oxide or metal nitride layer sheet to the substrate at an angle to the substrate plane; an inner dielectric sheet disposed between the reducible metal oxide or metal nitride layer sheets in each pair of reducible metal oxide or metal nitride layer sheets; and an outer dielectric sheet disposed between spaced apart pairs of reducible metal oxide or metal nitride layer sheets, wherein an edge of each reducible metal oxide or metal nitride layer sheet, inner dielectric sheet and outer dielectric sheet opposite the substrate are coplanar.

In certain aspects, each inner dielectric sheet has a first thickness, each outer dielectric sheet has a second thickness, and the second thickness is at least one order of magnitude greater than the first thickness. In various aspects, the inner dielectric sheets and the outer dielectric sheets comprise different dielectric materials.

In various examples, the structure may further comprise a groove located on an exposed end portion of each inner dielectric sheet opposite the substrate.

In certain aspects, the structure may comprise metal on the edge of each reducible metal oxide or metal nitride layer sheet that are coplanar to the edges of inner dielectric sheet and outer dielectric sheet opposite the substrate.

BRIEF DESCRIPTION OF THE DRAWING FIGURES

The subject matter of the present disclosure is particularly pointed out and distinctly claimed in the concluding portion of the specification. A more complete understanding of the present disclosure, however, may best be obtained by referring to the detailed description and claims when considered in connection with the drawing figures:

DETAILED DESCRIPTION

Figure 1:
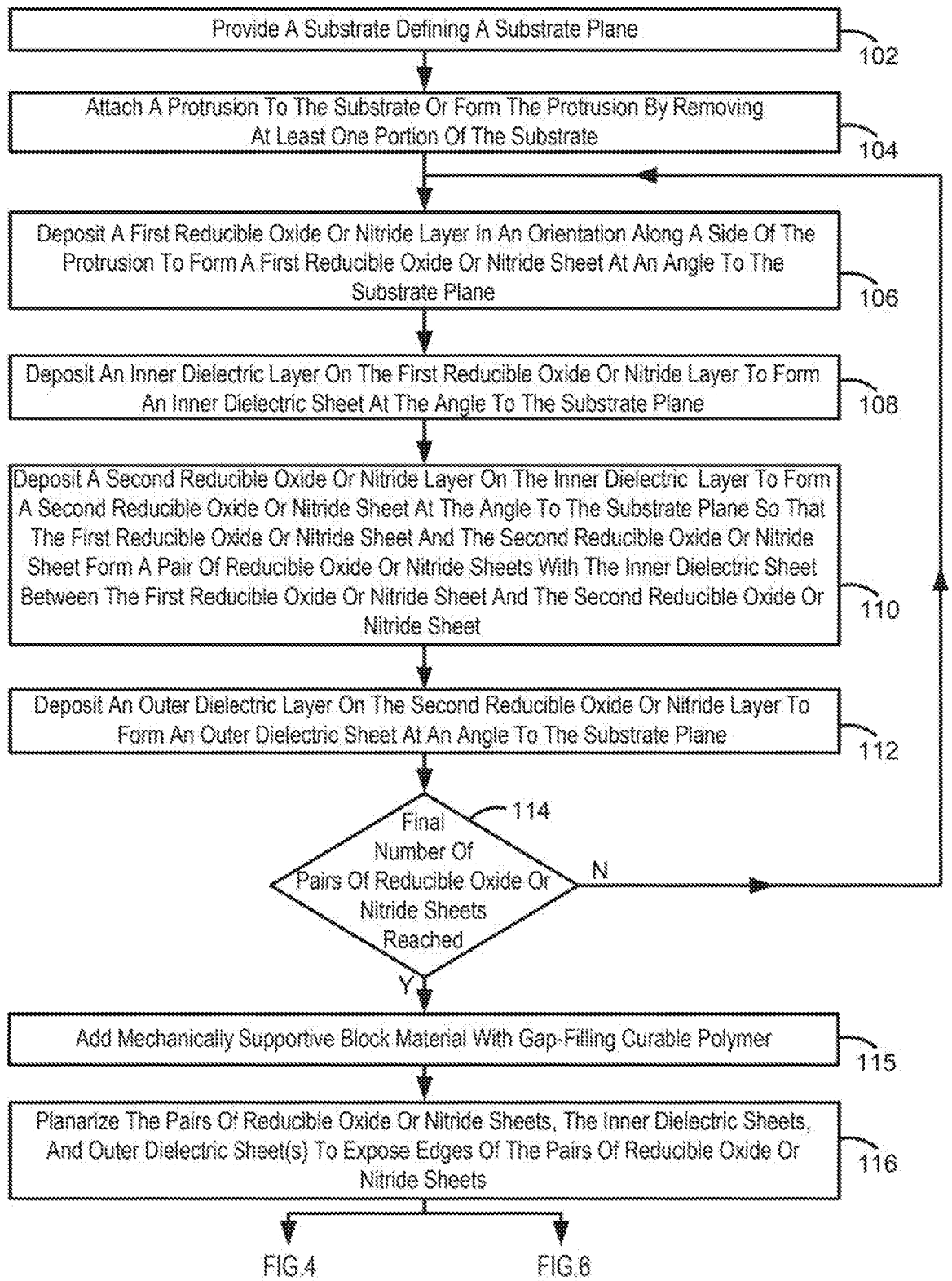
FIG. 1 is a flowchart depicting an embodiment of a fabrication process in accordance to the present disclosure.

In the following detailed description, numerous specific details are set forth to provide a full understanding of the present disclosure. It will be apparent, however, to one of ordinary skill in the art that the various embodiments disclosed may be practiced without some of these specific details. In other instances, well-known structures and techniques have not been shown in detail to avoid unnecessarily obscuring the various embodiments.

As described in more detail herein, various embodiments of the present disclosure generally comprise structures usable in molecular sensors and other devices, and methods of fabricating structures. In various examples, a structure comprises spaced apart electrode pairs, wherein the electrodes in each pair of electrodes are separated by an inner dielectric layer. Further, each pair of electrodes in a structure may be spaced apart by outer dielectric layers.

In certain variations, electrodes are first deposited as reducible metal oxide or metal nitride layers and the layers planarized to expose end portions of the metal oxide or metal nitride layers which can subsequently reduce to the corresponding metal.

Definitions and Considerations

As used herein, the term "structure" refers generally to physical constructs comprising at least one of a substrate layer, electrode layer, metal oxide layer, metal nitride layer, or dielectric layer, in any combination, such as structures formed by depositing metal, metal oxide, metal nitride and/or dielectric layers onto a substrate. A "structure" herein may be a part of a molecular sensor or part of a molecular electronics component or any other device. In some instances, a "structure" herein can be converted into a working molecular sensor by disposing a biomolecule or other molecule across a pair of electrodes or a pair of gold (Au) islands in a structure, amongst other processes. In some instances, a structure, e.g., comprising alternating electrode and dielectric layers on a substrate, may also be referred to as a structure usable in, or usable for, a molecular sensor.

As used herein, the term "device stack" generally refers to a structure having multiple layers of material, such as layers comprising metal, metal oxide or metal nitride, and dielectric layers, repeating in a pattern. In various examples, a device stack comprises a three-layer (or "tri-layer") arrangement comprising a dielectric layer disposed between two layers of metal, metal oxide, or metal nitride. In various embodiments, a device stack may comprise at least two spaced apart pairs of metal, metal oxide, or metal nitride layers separated by dielectric material, wherein the metal, metal oxide, or metal nitride layers of each pair are also separated by dielectric material.

As used herein, oblique angle deposition, or "OAD," refers to the process of depositing material, such as a metal, metal oxide, metal nitride, or dielectric, at an incident angle less than 90° relative to a planar substrate receiving the deposition. Normal deposition generally refers to deposition of materials orthogonal (90°) to a substrate, which necessarily creates layers that are co-planar with a top surface of the substrate. OAD, on the other hand, comprises deposition of materials onto a substrate at an angle less than 90°, (including at 0° or "horizontally"), such that vertical or other angled surfaces protruding from a substrate plane can also receive deposition of materials. The definition of OAD is extended herein to include 0° (also referred to as "horizontal" or "sideways") deposition, which can result in no material being deposited onto the top plane of a substrate sheet, but rather only deposition on the edge of the substrate facing the deposition stream and on the surfaces of any protrusions projecting from the substrate that include a surface facing the deposition stream. Herein, "low angle deposition" generally refers to OAD at an incident angle of from about 0° to about 20° relative to a major surface of a substrate, whereas "high angle deposition" generally refers to OAD at an incident angle of from about 20° to about 70° relative to a major surface of a substrate.

Figure 2:
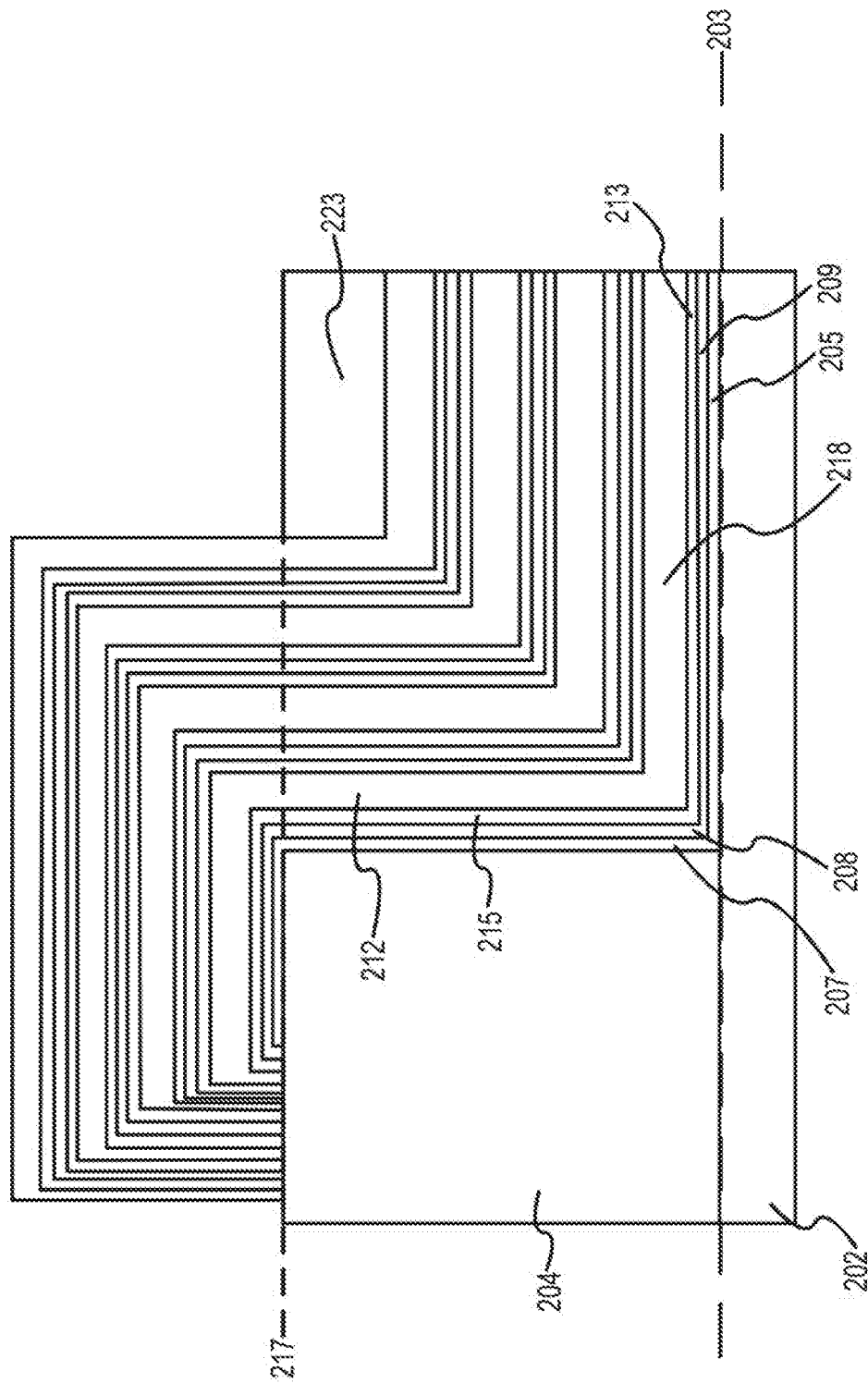
FIG. 2 illustrates a structure obtainable by fabrication processes of the present disclosure.
Figure 3:
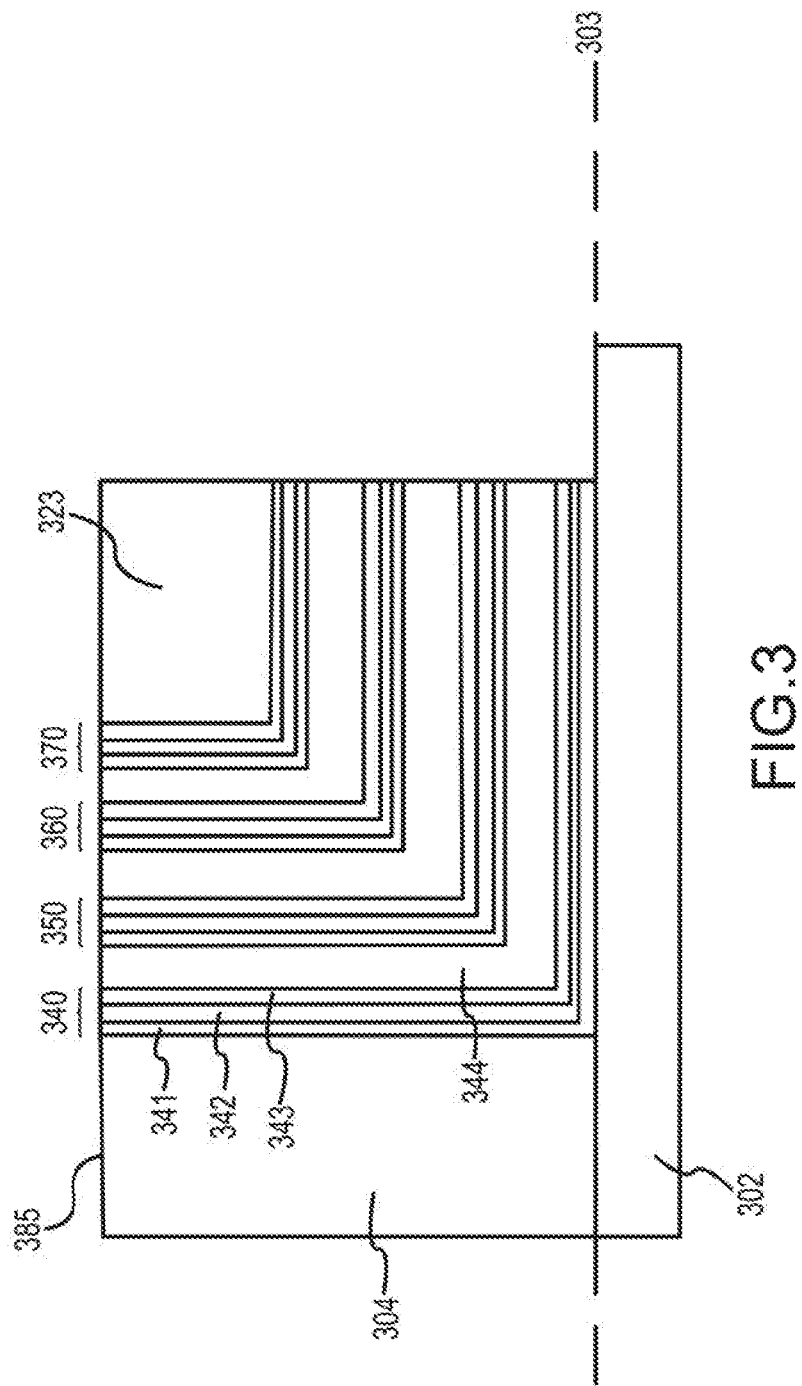
FIG. 3 illustrates an embodiment of a structure obtainable by planarizing the structure of FIG. 2.

With reference now to the drawing figures, FIG. 1 is a flowchart illustrating an embodiment of a fabrication method in accordance with the present disclosure. FIGS. 2 and 3 illustrate embodiments of structures that result from various aspects of the method of FIG. 1. For ease of understanding, the structures depicted in FIGS. 2 and 3 may be referred to in conjunction with the steps of the method in FIG. 1. Further, and as discussed in more detail herein, the method of FIG. 1 may continue to either the method of FIG. 4 or the method of FIG. 6 as indicated by the branched arrow at the bottom of the flowchart of FIG. 1.

In FIG. 1, an embodiment of a fabrication method begins with step 102, providing a substrate defining a substrate plane. A substrate herein is typically dimensioned such that the length L and width W are much larger (e.g., an order of magnitude larger) than the height H or thickness. A substrate provided in step 102 may comprise a square silicon (Si) wafer measuring about 10 mm L×10 mm W×0.5 mm H, or a similarly sized disc-shaped Si wafer. A substrate may further comprise an oxide deposit on one side, such as a $SiO_2$ deposit measuring about 100 nm to about 300 nm in thickness.

Substrates, such as wafers, can be described as having a top surface and a bottom surface, wherein these two surfaces are considered "major surfaces" because of their larger 2-dimensional size (L×W) relative to the thickness (H) of the substrate. The edges of a substrate are relatively small in comparison, and are thus considered minor surfaces. Although "top" and "bottom" are relative terms depending on orientation of an object with respect to an observer, a substrate wafer laying flat on a table parallel to the ground has a bottom surface in contact with the table, and a top surface that is visible to an observer looking down onto the substrate from above. Further, if the substrate wafer further comprises a $SiO_2$ or other deposit layer, then the layer is on the "top" surface. The top surface, a major surface, has a generally planar surface which defines a "substrate plane." The substrate plane can be defined by being parallel with a major surface of the substrate, such as a top or bottom surface used for supporting dielectric and/or electrode layers.

Fabrication on the top surface of a substrate may be at various angles to the substrate plane (such as 90° or vertical to the substrate plane) or may be parallel to the substrate plane (i.e., flat on the top surface, such as the case for a $SiO_2$ or other deposit layer on the top surface). With reference to FIG. 2, a fabricated structure may comprise a base substrate 202 on which various material layers are deposited. The substrate 202 defines a substrate plane 203. Similarly, in FIG. 3, a substrate 302 defines a substrate plane 303. In these examples, the substrates are generally square or rectangular wafers such that in cross-section they appear as rectangular cuboids.

With continued reference to FIG. 1, and in particular, step 104, a protrusion (e.g., a protrusion 204 in FIG. 2) is attached to the substrate to form a step-shape for the combined substrate and protrusion. In alternative embodiments, the protrusion is formed by removing (e.g., ablating) one or more portions of a larger block of substrate material, generating a cut-out "step" in the initially thicker supporting substrate. In various examples, a dielectric material in a block or other shape may be attached to the substrate to form the protrusion at a desired angle to the substrate plane. As noted above, the protrusion (regardless if attached material or formed by cutting out a step in a thicker substrate) protrudes from the substrate plane at an angle, such as about 90°. In various examples, a protrusion such as 204 in FIG. 2 may protrude from the substrate 202 at a different angle, such as for example, a 45° or 60° angle, relative to the substrate plane 203. A protrusion, such as protrusion 204 in FIG. 2, may comprise, for example, a dielectric material such as $SiO_2$, $Al_2O_3$, or MgO. The protrusion 204 can provide structural support for the depositing of dielectric and/or metal, metal oxide or metal nitride layers at an angle to the substrate plane 203.

Steps 106, 108, 110 and 112 provide an embodiment of a fabrication method to produce a tri-layer thin film structure or device stack further comprising spaced apart pairs of reducible metal oxide or metal nitride sheet. The steps comprise OAD (low or high angle), or any other deposition techniques. Complementary Metal-Oxide Semiconductor (CMOS) processes, such as OAD, can ordinarily allow for the layers to be deposited with an accurate and repeatable thickness. Steps 106, 108, 110 and 112 comprise (106) depositing a first reducible metal oxide or metal nitride sheet as a thin film; (108) depositing an inner dielectric thin film sheet over the first reducible metal oxide or metal nitride sheet; (110) depositing a second reducible metal oxide or metal nitride sheet as a thin film over the inner dielectric thin film sheet; and (112) depositing an outer dielectric thin film sheet over the first reducible metal oxide or metal nitride sheet. In this manner, the inner dielectric sheet comprise the separator layer between the reducible metal oxide or metal nitride sheets, while the outer dielectric thin film sheet comprises the separator between the pairs of reducible metal oxide or metal nitride sheets. This process may then be repeated to form multiple device stacks having a thicker dielectric separator sheet deposited between adjacent tri-layer stacks.

Depending on the incident angle of the OAD, these deposited layers provided by steps 106, 108, 110 and 112 in FIG. 1 may end up on the top surface of the substrate not covered by the protrusion, on an edge of the substrate wafer facing into the deposit stream, on a surface of the protrusion facing into the deposit stream, and on the top surface of the protrusion. In various embodiments, detachable shades may be added that can act as shields against the deposition onto one or more of these surfaces, such as for example, on the top surface of the protrusion. Such shades may comprise a detachable metallic, ceramic, or polymer material. In other examples, one or more sacrificial layers may be added to a surface targeted for OAD, including, for example, a dissolvable polymer layer, such as acetone-dissolvable (poly)methylmethacrylate (PMMA), common in lift-off processing in semiconductor fabrication. In other embodiments, no shields or sacrificial layers are used and a subsequent planarization step provides removal of any unwanted deposited layers from a structure.

Steps 106 and 110 in FIG. 1 may comprise deposition of metal thin film sheets, (e.g., comprising Au, Pt, Pd, Ag, Os, Ir, Rh, or Ru), rather than deposition of reducible metal oxide or metal nitride sheets, to produce spaced apart pairs of metal electrode sheets and dielectric separator layers. However, in some instances, each tri-layer structure acts as a capacitor, and the high capacitance may interfere with the deposition of subsequent layers, such as if steps 106, 108, 110 and 112 are repeated. Deposition of reducible metal oxide or metal nitride sheets, on the other hand, obviates the possibility for each tri-layer substructure to act as a capacitor. As discussed herein, a later chemical reduction of at least a portion of the reducible metal oxide or metal nitride sheets produces spaced apart electrode pairs, and avoids any deleterious effects of capacitance during various fabrication steps. In various embodiments, portions of each reducible metal oxide or metal nitride layer may be converted to highly conductive oxides (e.g., nickel (Ni) or cobalt (Co)) rather than to the corresponding metal.

The method exemplified in FIG. 1 further comprises a decision step 114. In step 114, it is determined whether a final number of pairs of reducible metal oxide or metal nitride sheets has been reached. In some implementations, the final number of pairs of reducible metal oxide or metal nitride sheets may be as few as one pair of reducible metal oxide or metal nitride sheets (i.e., one device stack). For two or more pairs of reducible metal oxide or metal nitride sheets, the steps 106 to 112 is repeated at least once more to provide for at least two pairs of reducible metal oxide or metal nitride sheets. In some implementations, the final number of pairs of reducible metal oxide or metal nitride sheets may be as large as several thousand pairs of reducible metal oxide or metal nitride sheets for example. The final number of pairs of reducible metal oxide or metal nitride sheets desired may depend on the design considerations for a sensor being manufactured from the fabricated structures disclosed herein, such as a desired testing speed, a type of molecule to be analyzed, or a desired footprint for the sensor, and other considerations. If the final number of pairs of reducible metal oxide or metal nitride sheets has not been reached in step 114, the process returns to step 106 to deposit another first reducible metal oxide or metal nitride layer on top of the previous outer dielectric thin film sheet.

Steps 106, 108, 110, 112 and 114 in FIG. 1 are better understood with reference to a structure produced by these steps and illustrated in FIG. 2. In FIG. 2, a protrusion 204 is attached to substrate 202, or a portions of a thicker substrate are cut away to form the step-like configuration. In the latter embodiment, substrate 202 and protrusion 204 comprise a contiguous material since the configuration was cut from a single block of substrate material. OAD at an angle of from about 20° to about 70° relative to the substrate plane 203 can produce the layering depicted in the structure of FIG. 2. In various examples, an incident angle of from about 30° and about 60° may be used. The high angle of deposition results in deposition of each thin film layer on both the substrate surface (or on the previous layer deposited on the substrate surface) and also on the surfaces of the protrusion 204 (or onto the layers previously deposited on the protrusion 204). The vertical or near vertical deposits on the protrusion 204 are labeled as first reducible metal oxide or metal nitride sheet 207, inner dielectric layer 208, second reducible metal oxide or metal nitride sheet 215, and outer dielectric layer 212, whereas the horizontal or near horizontal deposits are labeled as first reducible metal oxide or metal nitride sheet 205, inner dielectric layer 209, second reducible metal oxide or metal nitride sheet 213, and outer dielectric layer 218. The vertical or near vertical portion and the horizontal or near horizontal portion of each layer necessarily connect since each deposit was cast onto both surfaces in each OAD step.

Step 106 of the method of FIG. 1 provides the first reducible metal oxide or metal nitride layer 207/205, which is in contact with the top surface of the substrate, the side of the protrusion facing the deposit stream, and on the top surface of the protrusion. Any depositing of the multiple layers on the edge of the substrate 202 facing the deposit stream is ignored (or were shielded and thus prevented). Each subsequent layer is then on top of the previous layer. Step 108 of the method of FIG. 1 provides the inner dielectric layer 208/209. Step 110 of the method of FIG. 1 provides the second reducible metal oxide or metal nitride sheet layer 215/213. Lastly, step 112 of the method of FIG. 1 provides the outer dielectric layer 212/218. As evident from the structure in FIG. 2, repetition of the steps 106, 108, 110 and 112 of FIG. 1 provides the tri-layer stack as shown.

Depositing the reducible metal oxide or metal nitride layers and the dielectric layers at an angle to the substrate plane 203 can allow for exposing multiple pairs of reducible metal oxide or metal nitride sheets with a single planarization step. This can allow for scalability in fabricating a large number of reducible metal oxide or metal nitride pairs by depositing many reducible metal oxide or metal nitride and dielectric layers.

In various embodiments, OAD in steps 106 and 110 of FIG. 1 provide deposited reducible metal oxide or nitride layers (e.g., 207, 215 in FIG. 2) of from about 1 nm to about 100 nm in thickness. In some examples, the thickness of the deposited metal oxide or nitride layers is from about 1 nm to about 40 nm, or from about 5 nm to about 15 nm. In other examples, the thickness of the metal oxide or metal nitride layers is from about 2 nm to about 15 nm. The tolerance in the thicknesses of all of the deposited metal oxide or nitride layers is about 5%. The number of deposited metal oxide or nitride layers total from 2 to at least 10,000 layers. The depositing of reducible oxide or nitride layers may comprise RF sputtering, any other PVD, CVD, ALD methods, or electrodeposition.

A reducible metal oxide material for deposition herein can be selected from transition metal oxide or refractory metal oxide. In various embodiments, the reducible metal oxide material may comprise, but is not limited to, NiO, CoO, FeO, CuO, $ZrO_2$, $TiO_2$, $VO_2$, $Cr_2O_3$, and mixtures thereof. A reducible metal nitride material for deposition herein can be selected from p-block element nitrides, alkaline earth nitrides, transition metal nitrides and refractory metal nitrides. Nitrides for use herein include, but are not limited to, the nitrides of Mg, Be, Ca, Sr, Li, Zn, B, Si, Al, Ga, In, Tl, Zr, W, Ti, Va, Ta, Nb, Ni, Cr, Co, Fe, Ag, Au, Pt, Pd, Zr, Hg, and Cu. In various examples, nitrides that can provide a conductive metal upon reduction are useful. These include, but are not limited to, AuN, TiN, PtN, $Pd_3N_4$, ZrN, $Ni_3N_2$, $Zn_3N_2$, VN, CrN, $Fe_2N$, $Ag_3N$, $Co_2N$, $Co_4N_2$, and $Cu_3N$. In other embodiments, a metal oxide or nitride is converted to a highly conductive metal oxide, e.g., to produce a nickel or a cobalt oxide.

In various embodiments, deposition steps 108 and 112 of FIG. 1 comprise deposition of inner and outer dielectric layers (e.g., inner dielectric layer 208 and outer dielectric layer 212 in the structure of FIG. 2). The dielectric material can include an oxide, nitride, or fluoride, or other dielectric material, provided the material is not easily reduced during the process of reducing portions of the metal oxide or metal nitride layers to metal. In certain examples, inner and outer dielectric layers may comprise any combination of oxides such as $SiO_2$, MgO, CaO, $Al_2O_3$, various rare earth oxides, or other oxide, nitride (e.g., AlN, $Si_3N_4$, refractory nitride, rare earth nitride or a mixture of nitrides), fluoride, oxyfluoride, or oxynitride, or any other dielectric material not easily reduced by hydrogen annealing, forming gas (e.g., 5 vol. % $H_2$ in 95% Ar gas), or other reductive methods.

As illustrated in the structure of FIG. 2, deposition of the non-reducible dielectric layers 208/209, e.g., by sputter deposition, CVD, or ALD deposition, results in a thickness of from about 1 nm to about 40 nm for the inner dielectric layers 208/209. In other examples, the thickness of the inner dielectric layers is from about 2 nm to about 15 nm thick. The tolerance in the thicknesses of all of the deposited inner dielectric layers is about 5%.

In various embodiments, each outer dielectric layer 212 separating neighboring tri-layer device stacks may have a width of from about 500 to at least about 20,000 nm, or about one order of magnitude thicker than the thickness of any one inner dielectric sheet separating first and second reducible metal oxide or metal nitride layers in a device stack. In various examples, a thickness for an outer dielectric layer 212 can be, for example, in the range of from about 500 to about 5,000 nm. The tolerance in the thicknesses of all of the deposited outer dielectric layers is about 5%. A separation between adjacent tri-layer device stacks of about 500 to about 5,000 nm reduces electrical, inductive, capacitive, or other interferences.

In various embodiments, a desired thickness for each of the outer dielectric sheets can be at least about 1 μm or at least about 10 μm, while a desired thickness for each of the inner dielectric sheets can be at most about 50 nm or at most about 20 nm. In some implementations, the thickness of the inner dielectric sheets can be at most about 10 nm. Having an accurately controlled inner dielectric layer thickness can improve the chances for reliable and reproducible attachment of certain molecules to the pairs of metal sheets once reduced from the oxide or nitride. Reliable and reproducible attachment of certain molecules in a molecular sensor results in more accurate readings from a molecular sensor constructed out of the structures herein, since it is less likely that other types of molecules inadvertently attach given the relatively precise spacing to coordinate with the size of the chosen molecules.

With continued reference to FIG. 2, utilizing OAD without any dissolvable sacrificial layers or removable shades on the protrusion 204 results in the top surface of the protrusion 204 (the surface opposite the substrate 202) being covered with multilayer thin films. Nonetheless, a planarization polishing process removes these film depositions on the surface of the protrusion 204 so as to achieve a structure as in FIG. 3. In some instances, the very top layer of the protrusion 204 is sacrificed in the planarization that removes all of the layers deposited on the protrusion 204.

In other embodiments, a thin adhesion promoting layer may be deposited at the interface between the metal oxide or nitride sheets and the inner dielectric sheet to improve the adhesion at the interface. For example, an about 1 to about 5 nm thick film may be deposited at any interface of layers. In various examples, the film may comprise a material such as Ti, Cr, Al, Zr, Mo, Nb, Ta, or Hf.

With reference again to FIG. 1, various embodiments of a fabrication method in accordance with the present disclosure further comprise step 115, which is to add a mechanically supportive block material to the structure resulting from the repetition of deposition steps 106, 108, 110 and 112. A mechanically supportive block can be added with a gap-filling curable polymer. A mechanically supportive block material may be attached adjacent to the deposited multi-layer stack. In some implementations, this is accomplished by attaching a block of ceramic material or polymer material, or by depositing a polymer material and subsequently curing the polymer. Any space between the added supporting block and the previously deposited multilayers can be filled with a UV-curable, electron beam curable, or thermally curable polymer such as PMMA or hydrogen silsesquioxane (HSQ) resist. The HSQ resist layer thus deposited can be hardened by additional thermal curing to be close to the hardness of $SiO_2$ type material. The mechanically supportive block material can be added in step 115 to facilitate subsequent planarization of the structure, as discussed herein. Further a mechanically supportive block material can provide support during subsequent manipulations of the structure, such as during a subsequent packaging into devices.

An exemplary mechanically supportive block material 223 is illustrated on the structure of FIG. 2. As disclosed, this material can be added in step 115 by attaching a block of ceramic material or polymer material, or by depositing a polymer material and subsequently curing the polymer.

With reference again to the method of FIG. 1, step 116 comprises planarizing the structure produced from the previous steps in FIG. 1. As discussed, the added mechanically supportive block material aids in mechanically stabilizing the structure during the planarization process. The step 116 of planarizing may comprise, for example, CMP polishing, focused ion beam (FIB) etching, or PMMA or HSQ filling and subsequent "etching back" by reactive ion etch (RIE). Planarization step 116 levels all of the top edges of the metal oxide or nitride layers along with the inner and outer dielectric layers. The step 116 also exposes end portions of each of these layers, on which certain additional processes may be implemented.

Planarization step 116 of FIG. 1 is more clearly understood by reference to the structure in FIG. 3, which is an exemplary structure resulting from planarization of the structure in FIG. 2 across the planarization plane 217. Planarization plane 217 may be substantially parallel to substrate plane 203, or may be at an angle relative to substrate plane 203. Note that the structure in FIG. 3 would look the same if the planarization plane 217 in FIG. 2 was lowered slightly closer to the substrate plane 203 such that a small portion of the protrusion 204 and a small portion of the mechanically supportive block material 223 were both sacrificed. In various examples, planarization at plane 217 or just below the top surface of the protrusion 204 suffices to remove the very top surfaces of the protrusion 204, the metal oxide or nitride sheets, the inner dielectric sheets, and the outer dielectric sheets, to expose the edges of all of the layers and to level them substantially co-planar with the top surface of the protrusion 204. In various embodiments, planarization results in a structure having a top surface 385 substantially parallel to the substrate plane 303, as illustrated by the resulting structure of FIG. 3.

With continued reference to FIG. 3, the planarized structure illustrated comprises protrusion 304, mechanically supportive block material 323, and a number of tri-layer device stacks 340, 350, 360, 370, and so forth, (depending on how many times steps 106, 108, 110 and 112 in FIG. 1 were repeated prior to planarization), all with co-planar top surfaces exposed from the planarization step. Each device stack, such as tri-layer stack 340 further comprises a first reducible metal oxide or metal nitride layer 341, an inner non-reducible dielectric layer 342, and a second reducible metal oxide or metal nitride layer 343. Each tri-layer stack is arranged with the inner non-reducible dielectric layer sandwiched between two reducible metal oxide or metal nitride layers. Each tri-layer stack, 340, 350, 360, 370, etc., is separated by a wider outer dielectric layer, such as outer dielectric layer 344 that separates tri-layer stack 340 and tri-layer stack 350. At top surface 385, each of the layers 341, 342, 343, 344, and so forth, (depending on total number of tri-layer device stacks), further comprise exposed end portions co-planer with the top surface 385. These exposed end portions, made by planarization, are available for subsequent manipulation such as reductive chemistry.

Figure 4:
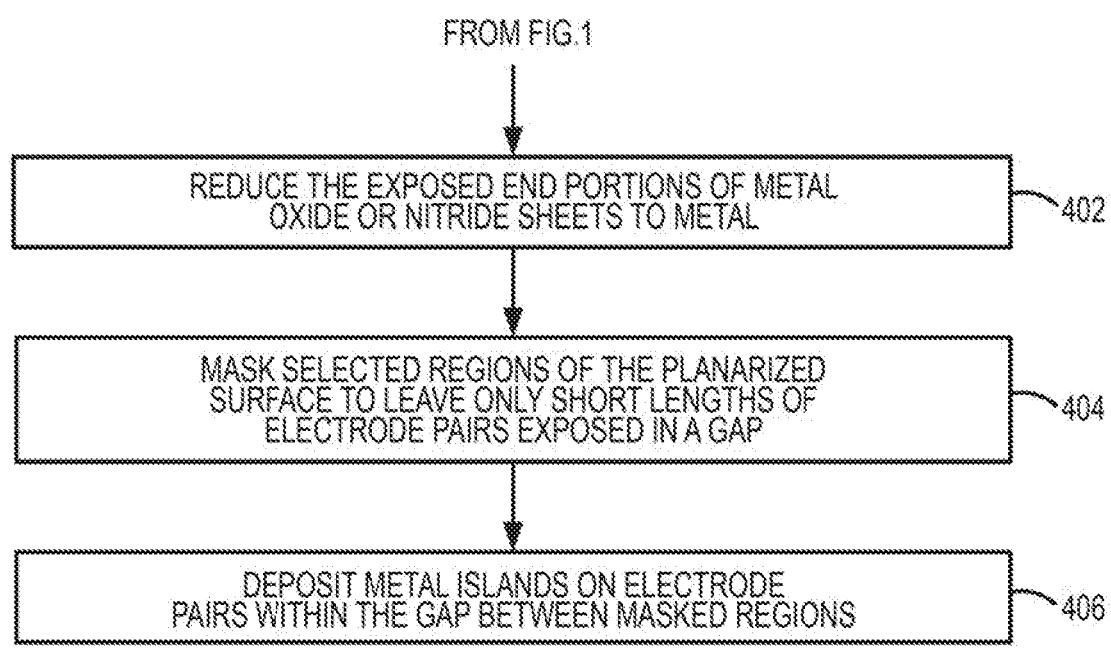
FIG. 4 is a flowchart depicting an embodiment of a fabrication process in accordance to the present disclosure.

FIG. 4 is a flowchart of an embodiment of a fabrication method that begins with a planarized substrate (such as the structure illustrated in FIG. 3) and comprises a continuation of the method of FIG. 1. FIG. 4 describes the process of obtaining gold (Au) electrode islands beginning with accurate thickness controlled metal oxide or metal nitride layer pairs. In other embodiments, a structure such as in FIG. 3 may be sliced into several or more wafers or "chips" prior to reduction of metal oxide or nitride to metal. The slicing may be conducted parallel to the plane 303 of substrate 302 to produce wafers of uniform dimensions. Then a plurality of these wafers may be collectively exposed to the reduction conditions in Step 402.

Step 402 of the method of FIG. 4 comprises reducing the exposed end portions of the reducible metal oxide or metal nitride sheets within each tri-layer device stack using a suitable reducing agent, such as hydrogen, optionally in an inert atmosphere such as Argon (Ar).

In certain instances, the reduction of a reducible metal oxide, such as NiO, CoO, FeO, CuO, by hydrogen follows the generalized chemical equation:

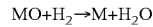

$$MO+H_2 \rightarrow M+H_2O$$

In certain instances, the reduction of a reducible metal nitride, such as $Fe_2N$, with hydrogen follows the generalized chemical equation (also called "denitridation"):

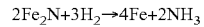

$$2Fe_2N+3H_2 \rightarrow 4Fe+2NH_3$$

The depth to which the exposed end portion of a reducible metal oxide or metal nitride sheet is reduced by these and other reactions is dependent on the reducing atmosphere strength (i.e., $[H_2]$), the temperature and pressure and length of time of the reaction, amongst other variables. In various examples, the reduction of a reducible transition metal oxide, such as NiO, CoO, FeO, CuO, or refractory metal oxides like $ZrO_2$, $TiO_2$, or the reduction of a reducible transition metal nitride, such as $Ti_2N$, $TiN_{0.9}$, TiN, $V_2N$, VN, $Cr_2N$, CrN, $Mn_4N$, $Mn_2N$, $Mn_3N_2$, $Fe_4N$, $Fe_2N$, $Co_3N$, $Co_2N$, $Ni_3N$, ZrN, $Nb_4N_3$, $Nb_2N$, NbN, $NbN_{0.95}$, $Mo_2N$, MoN, $TcN_{0.75}$, $Hf_3N_2$, HfN, $Ta_3N_5$, $Ta_2N$, TaN, $TaN_{0.8}$, $TaN_{0.1}$, $W_2N$, WN and $Re_2N$, by hydrogen is conducted at a temperature of from about 300° C. to about 800° C. In other examples, step 402 may comprise a forming gas anneal conducted at from about 300° C. to about 600° C. The reaction conditions may be adjusted so as not to adversely affect the exposed end portions of any of the inner or outer dielectric sheets comprising a non-reducible oxide such as $SiO_2$, $Al_2O_3$, or MgO.

In various examples, methods for reducing exposed end portions of the reducible metal oxide or nitride layers without damaging the exposed end portions of the inner and outer dielectric sheets include, but are not limited to, providing selective reducing conditions (e.g., particular concentration of reducing gas, pressure and temperature), and providing different materials between reducible metal oxide or nitride layers and the dielectric layers. In the latter method, for example, the reducible metal oxide or nitride layers may comprise only nitride, whereas the inner and outer dielectric layers may comprise only oxide. In other instances, the reducible oxide or nitride layers may comprise only an oxide, but the metal of the oxide may be different from the metal of the oxide in the inner and outer dielectric layers. For example, a reducible metal oxide layer may comprise $TiO_2$ whereas the inner and outer dielectric layers may comprise $SiO_2$.

In various embodiments, the reduction step 402 in the method of FIG. 4 results in the formation of metal from the reducible metal oxide or metal nitride to a depth of from about 10 nm to about 10 μm as measured from the exposed end surface created by the planarization step. Thus, a structure after step 402 comprises metal electrode pairs at the top surface of the structure, i.e., the planarization surface, with the electrode metal ranging to a depth of from about 10 nm to about 10 μm. The remaining portions of the metal oxide or metal nitride sheets are inaccessible to the reducing agent and remain as oxide or nitride material. However, it is important to note that the sides of the structure (e.g., the sides perpendicular to the planarized surface) are also exposed to the reducing atmosphere, and thus the resulting metal electrodes extend all the way from the planarized top of the structure down to the substrate for at least two sides of the structure or on each side that is exposed to the reducing conditions. If the resulting reduced structure is then cross-sectioned perpendicular to the planarized top surface (e.g., see FIG. 5B which illustrates this), then the depth of the reduction from the top can be seen. In various embodiments, reduction of metal oxide or nitride to the corresponding metal on one side of a structure, all the way from substrate up to top planarized surface, facilitates a later connection of the sheets into electrical circuits, regardless that inner portions of the metal oxide or nitride sheets still remain oxide or nitride.

In some variations, exposed end portions of metal oxide sheets are partially converted to highly conductive oxides, or to a mixture of metal and metal oxide. These conversions may be dependent on the lattice structure of the metal oxides.

The method then proceeds with step 404 to obtain a narrow exposed gap across the exposed end portions of the electrode pairs created in step 402. In step 404, two portions of mask, e.g., dielectric cover layers, are deposited on the top planarized surface of the device stack orthogonal or close to orthogonal to the electrode strips, and separated by a gap, thereby exposing only a short length of each end portion of the electrode sheet pairs within this gap. In other variations, two masked regions separated by a gap may be formed by using a patterning process, such as e-beam lithography or nano-imprinting, followed by etching an unmasked region to form the gap. In other examples, a mask line may be deposited on the planarized top surface of the structure, perpendicular to the exposed edges of electrodes and dielectric layers appearing as parallel strips on the planarized surface. The mask line can be deposited on the top surface of the structure using, for example, an HSQ resist. Two portions of dielectric cover layer are then deposited on both sides of the mask line. After removal of the mask line, the dielectric cover layer appears as a single portion with a "window" where the mask line was, having a width of the desired gap. In some examples, the gap between dielectric cover layers can have a width between about 2 nm to about 40 nm, or from about 5 to about 15 nm, such as to facilitate targeted deposition of metal islands and/or selective attachment of only a single molecule across each pair of electrode strips. The dielectric cover layers forming these masked regions are optionally removable. This process is more clearly understood when the structures that result from these steps are illustrated and described. The mask material may comprise, for example, $SiO_2$, or polymethylmethacrylate (PMMA).

In step 406, small metal "islands" are deposited on the exposed electrode pairs such that there is one metal island per electrode, located close to the end of the electrode facing the other electrode in the pair of electrodes. These metal islands may comprise gold (Au), platinum (Pt) or palladium (Pd), amongst other metals. The metal islands may be electro-deposited or vacuum deposited onto the ends of the electrodes.

In various embodiments, steps 402, 404 and 406 of FIG. 4 produce the various structures depicted in FIGS. 5A-5D.

Figure 5A:
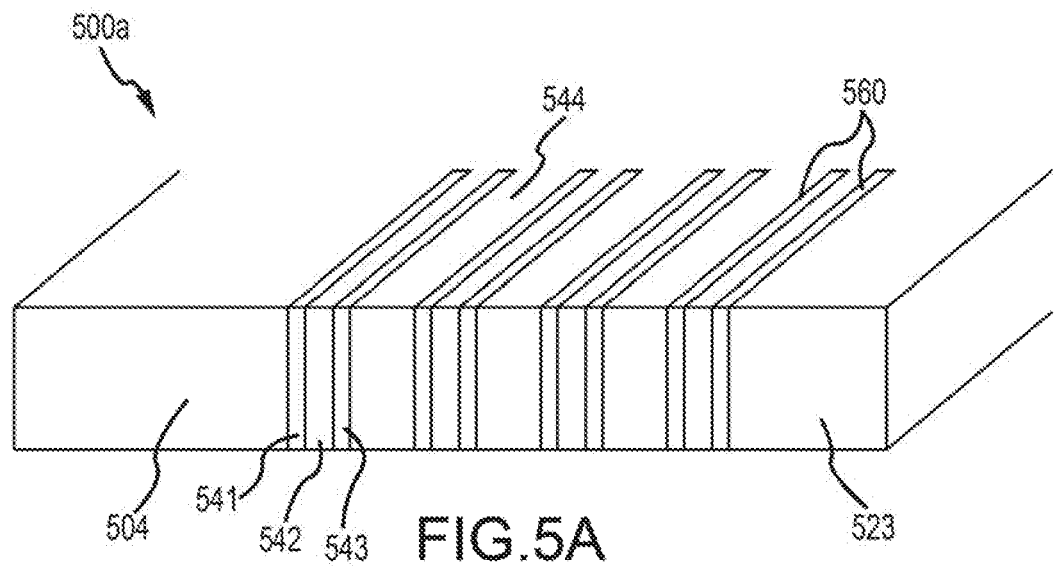
FIGS. 5A-5D illustrate embodiments of structures obtainable by fabrication processes of the present disclosure.

With reference now to FIG. 5A, a planarized structure (e.g., resulting from completion of the steps of FIG. 1) comprises an arrangement of reducible metal oxide or metal nitride sheet pairs, each pair separated by outer dielectric layers and each metal oxide or metal nitride sheet within a pair of sheets separated by an inner dielectric layer. Specifically, the structure 500a comprises the protrusion 504, first reducible metal oxide or metal nitride layer 541, inner dielectric layer 542, second reducible metal oxide or metal nitride layer 543, and outer dielectric layer 544, with the entire stack planarized on the surface opposite the substrate. The pattern including the elements 541, 542, 543 and 544 repeats for as many times as the method steps 106, 108, 110 and 112 of FIG. 1 were repeated. The structure 500a shows a stack of layers resulting from only 4-cycles of the deposition process, followed by planarization to level the layers into coplanarity and provide the exposed end portions of each layer on the surface opposite the substrate. Note that in structure 500a the last outer dielectric layer was not deposited, and instead, a mechanically supportive block material 523 was used at the end of the multi-layered stack for mechanical support, which is attached to the final second reducible metal oxide or metal nitride layer.

With continued reference to structure 500a in FIG. 5A, the top of the structure opposite the substrate comprises the exposed end portions 560 of each of the reducible metal oxide or metal nitride layers. This planarized top surface also comprises exposed end portions for all of the inner and outer dielectric layers, the protrusion and the mechanically supportive block material (unlabeled in this illustration). These exposed end portions of reducible metal oxide or metal nitride layers, the inner and outer dielectric layers all appear as thin parallel strips on the planarized top surface of the structure. The exposed end portions of reducible metal oxide or metal nitride layers are available for reduction to the corresponding metal, e.g., by exposure to $H_2$.

Figure 5B:
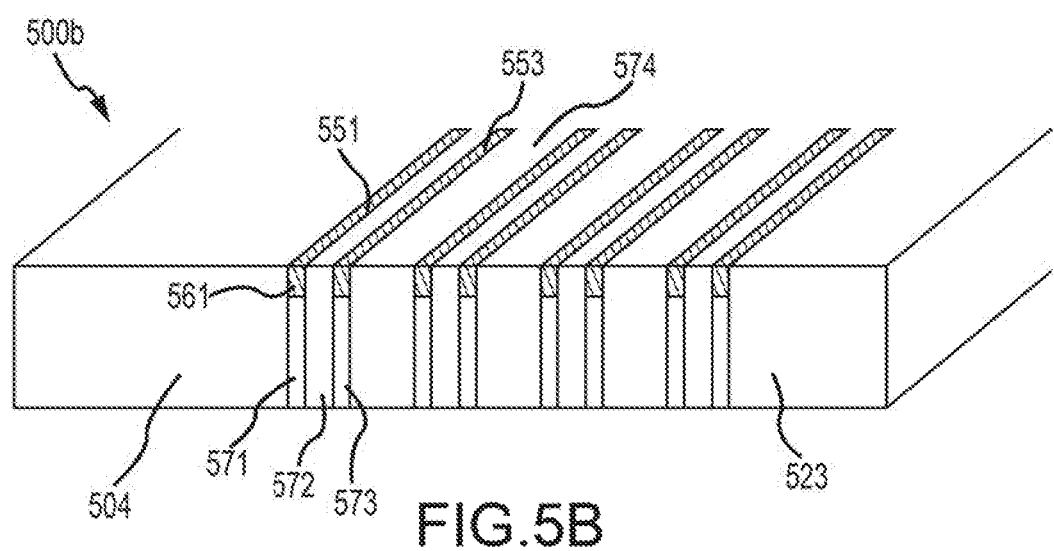

FIG. 5B illustrates the structure 500b resulting from reduction of portions of the reducible metal oxide or metal nitride layers in the structure 500a of FIG. 5A, in accordance with step 402 in FIG. 4. The exposed metal portions 551 and 553 are the result of treatment of the structure 500a in FIG. 5A with a suitable reducing agent that reduces the exposed reducible metal oxide or nitride end portions into the corresponding base metal. With the structure 500b cross-sectioned as shown, the depth of the reduction from oxide/nitride to metal can be seen by the height of the metal portions 561 and 563, which measure from about 10 nm to about 10 µm in height. The cross-sectioned portion of the structure shown also shows the remaining reducible metal oxide or metal nitride material 571 and 573 untouched by the reducing conditions. Other than on the sides of the structure, these intact metal oxide or metal nitride portions extend down to the substrate. As illustrated in structure 500b, the inner dielectric layers, e.g., 572, the outer dielectric layers, e.g., 574, as well as the protrusion 504 and the mechanically supportive block material 523 remain untouched by the reducing conditions for converting exposed portions of metal oxide or nitride to metal.

Figure 5C:
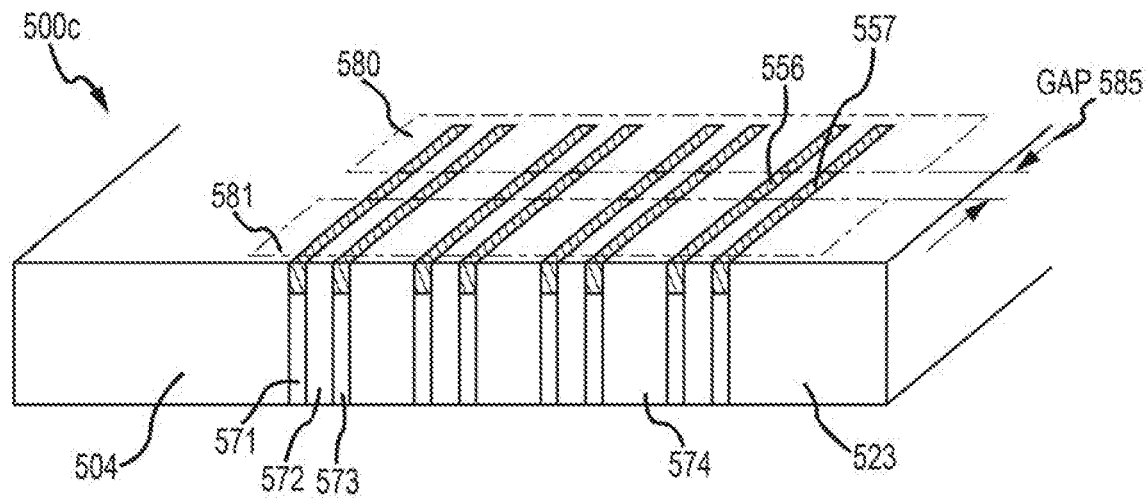

FIG. 5C illustrates an embodiment of a structure 500c resulting from addition of mask layers onto the planarized surface of substrate 500b in FIG. 5B in order to block some of the surface area of the metal strips, in accordance with step 404 of FIG. 4. The masked structure 500c comprises two masked layer portions 580 and 581. Since the exposed parallel metal strips span across the planarized surface of the structure, there may be too much exposed metal surface area for precise placement of metal islands onto the metal strips. Thus, the purpose of the mask regions 580 and 581 is to mask all of the exposed metal strips except for short segments such as 556 and 557. As mentioned in the context of FIG. 4 and step 404, the masked regions may be deposited on the planarized surface substantially perpendicular to the parallel metal strips, such as with two portions of masking separated by a gap of from about 2 nm to about 40 nm, or from about 5 to about 15 nm for targeted placement of metal islands and/or for controlled attachment of molecules onto the metal electrode strips. The gap is indicated as "GAP 585" in structure 500c of FIG. 5C. As mentioned herein, the masking need not comprise separate masking layer portions, but may instead comprise a continuous portion with a "window" defining the gap.

With continued reference to FIG. 5C, the exposed portions 556 and 557 of each electrode strip, appearing substantially as rectangles of nanoscale proportions, measure, for example, from about 1 nm to about 40 nm, or from about 5 nm to about 15 nm, or from about 2 nm to about 15 nm in width, by about 2 nm to about 40 nm, or from about 5 to about 15 nm in length. In various embodiments, an exposed electrode strip segment 556 may measure about 2 nm in width by about 10 nm in length. In other embodiments, the exposed strip segment 556 may measure about 5 nm in width by about 15 nm in length. These short segments of electrode strips then become the targets for metal island deposition, as per step 406 of FIG. 4.

Figure 5D:
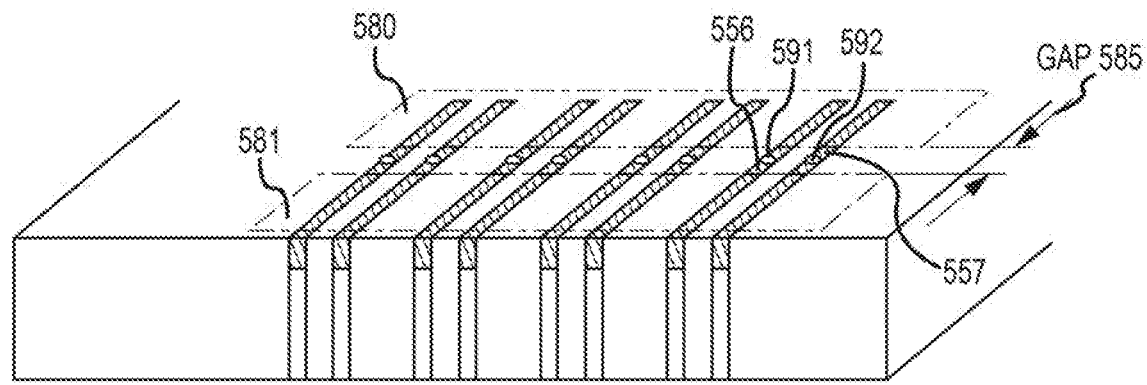

FIG. 5D illustrates an embodiment of a structure 500d resulting from metal island deposition to the exposed portions of the electrode strips, in accordance with step 406 of FIG. 4. As discussed in the context of FIG. 4, gold (Au), platinum (Pt) or palladium (Pd) islands may be deposited onto the exposed electrode strip segments by electro-deposition or vacuum deposition, for example. As illustrated in FIG. 5D, the metal islands 591 and 592 (e.g., comprising Au, Pt, or Pd), are deposited on the exposed electrode strip segments 556 and 557 respectively. In various embodiments, one discrete island is deposited per exposed electrode strip segment. In certain aspects, the GAP 585 can be narrowed as necessary to promote deposition of only one metal island per exposed electrode strip segment. As shown in the exemplary structure 500d of FIG. 5D, each exposed electrode strip segment has a single metal island deposited thereon. The structure is only shown with eight such segments and islands, although as discussed herein, the number of these segments and islands may number in the thousands, tens of thousands, hundreds of thousands, millions, tens of millions, or more.

In an optional step, the metal islands, e.g., Au, Pt or Pd islands 591 and 592 in FIG. 5D, may be "balled up" into substantially spheroidal configuration by an annealing step. The metal islands initially deposited may be square or rectangular in shape, and therefore the annealing step after deposition can further reduce the exposed surface area of the deposited islands by converting each island into more of a spheroidal shape. After reshaping of the metal islands, molecules may then be bonded to each metal island. In various embodiments, a single long molecule, such as a double-stranded DNA oligomer, with both the 3' and 5' ends functionalized with groups capable of bonding to the metal islands, may be placed across each pair of metal islands in each electrode pair.

Figure 6:
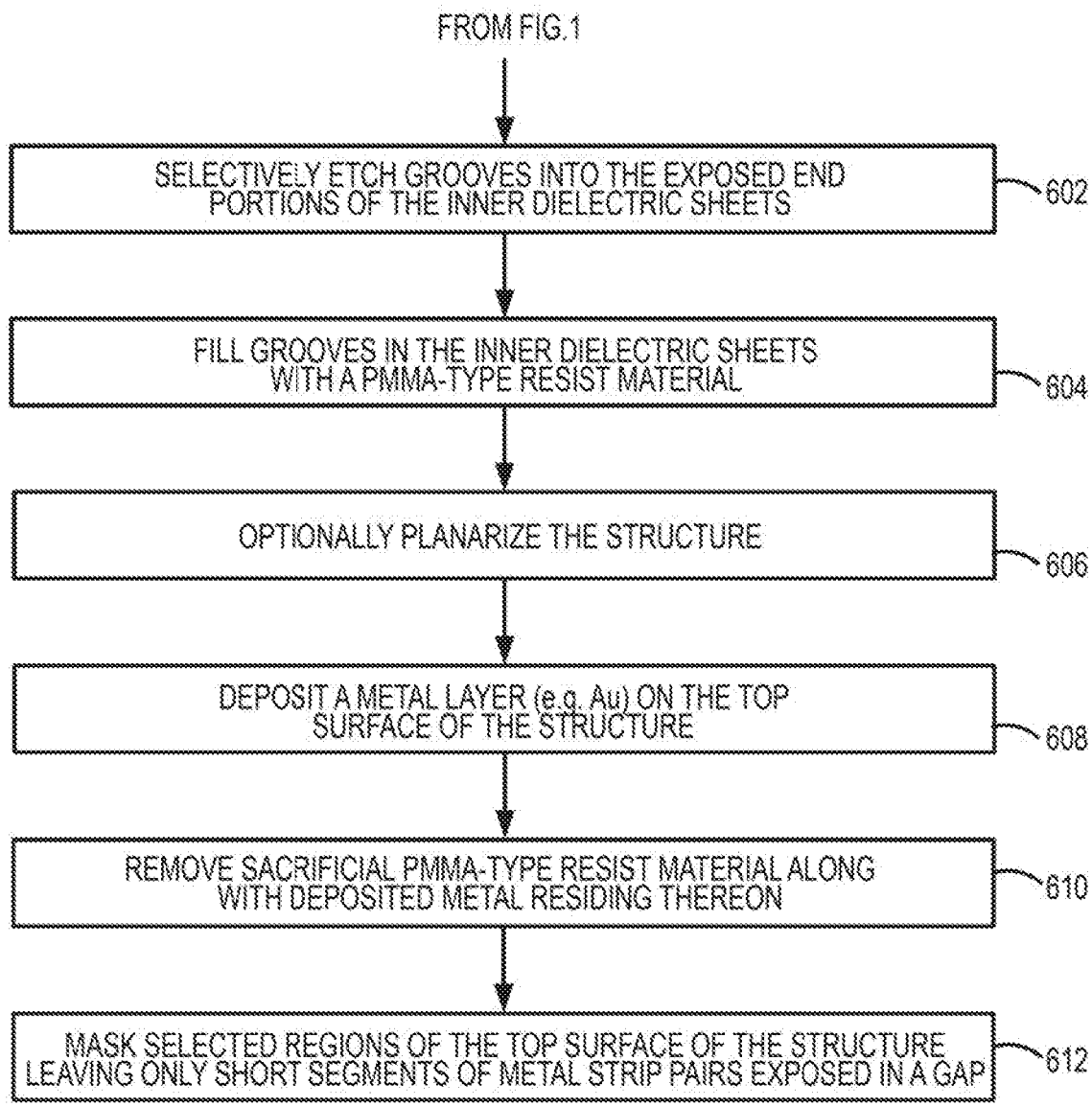
FIG. 6 is a flowchart depicting an embodiment of a fabrication process in accordance to the present disclosure.

FIG. 6 sets forth another embodiment of a method of producing a structure usable in a molecular sensor that also begins from the end of the method of FIG. 1. As indicated at the bottom of FIG. 1, processes to reach a structure usable in a molecular sensor may follow two separate and distinct pathways, namely the method depicted in FIG. 4 or the method depicted in FIG. 6.

Figure 7A:
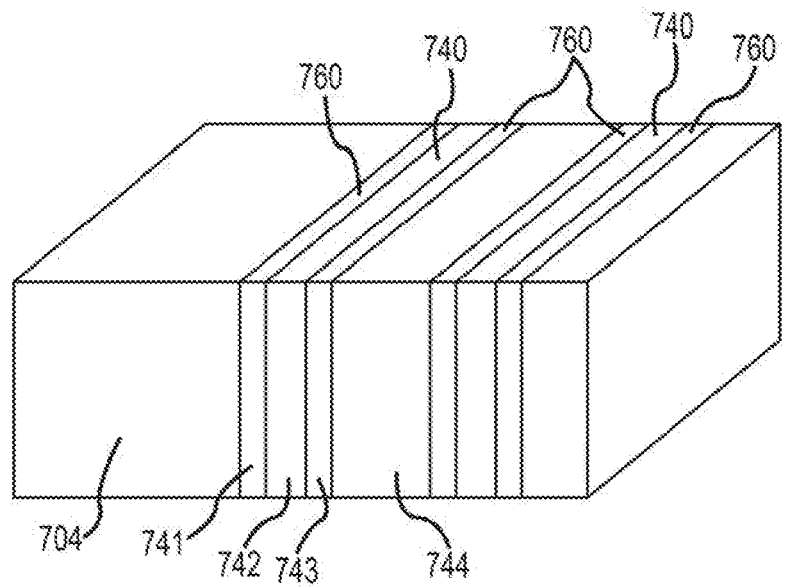
FIGS. 7A-7F illustrate embodiments of structures obtainable by fabrication processes of the present disclosure.

The fabrication method exemplified by the steps in FIG. 6 comprises a metal deposition and selective lift-off process to provide metal islands on electrode strips. The fabrication process begins with a planarized structure, such as the structure depicted in FIG. 3, or the similar structure depicted in FIG. 7A, or wafer slices obtained therefrom. In these beginning structures, the exposed end portions of the protrusion, reducible metal oxide or nitride layers, the inner and outer dielectric layers, and the optional mechanically supportive block material are coplanar, and the exposed end portions of the reducible metal oxide or nitride layers and the inner dielectric layers appear as parallel bands or strips on the top planarized surface of the structure.

In various embodiments, a structure usable in the metal deposition and selective lift-off process set forth in FIG. 6 may comprise different materials for the reducible metal oxide or nitride layers and the inner dielectric layers, such as to enable selective etching of the inner dielectric layers in the presence of the reducible metal oxide or nitride layers. In a non-limiting example shown in FIG. 7A, the inner dielectric layers 742 may comprise $SiO_2$, whereas the reducible metal oxide or nitride layers 741, 743 may comprise NiO, CuO or CoO, such as to allow for selective etching of the exposed end portions 740 of the inner dielectric layers in the presence of the exposed end portions 760 of the reducible metal oxide or nitride layers. In various aspects, the protrusion (e.g., protrusion 704 in FIGS. 7A-F) may also comprise a dielectric material such as $SiO_2$, $Al_2O_3$ or MgO, and the protrusion may also be etched concurrently with the exposed end portions of the inner dielectric layers. The exemplary structure in FIG. 7B illustrates a result of selective etching of both the exposed end portions 740 of the inner dielectric sheets and the exposed top surface of the protrusion 704, without damage to the exposed end portions 760 of the reducible metal oxide or nitride layers.

Figure 7B:
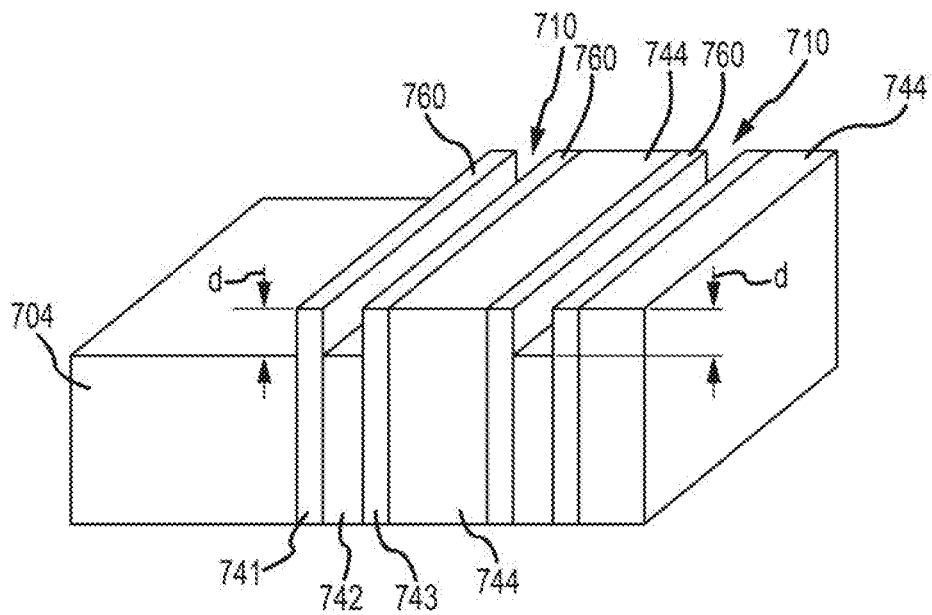

The first step 602 of the fabrication process in FIG. 6 comprises selective etching of the exposed end portions of the inner dielectric layers to form grooves, (e.g., grooves 710 in FIG. 7B). In some implementations, removal of an exposed end portion of inner dielectric material to create each groove can be accomplished by etching the inner dielectric sheet using an etching process such as RIE, sputter etching, or chemical etching, such as with HF. In these ways, a groove 710 is formed in each of the inner dielectric sheets. In various embodiments, each groove etched in the inner dielectric sheets measures from about 0.1 to about 1 mm in depth from the planarization surface, as illustrated by the dimension "d" in FIG. 7B. In other words, the extent of removal of inner dielectric sheet material, "d," is from about 0.1 to about 1 nm from the exposed end portion of the inner dielectric sheet 742 created by the planarization. Removal of the exposed end portions of each of the inner dielectric sheets provides free space for depositing PMMA-type resist in the next step 604 of the process. In this particular example in FIG. 7B, illustrating the effects of selective etching (step 602 in FIG. 6), the protrusion 704 is shown to also be etched to about the same degree as the exposed end portions of the inner dielectric sheets. Such concomitant etching can be seen in structures wherein the protrusion 704 comprises the same material as the inner dielectric sheet layers, such as $SiO_2$.

Depending on the method used to remove the exposed end portions of each inner dielectric sheet, the groove (e.g., 710 in FIG. 7B) thus created may have a shape other than rectangular cuboid as illustrated. For example, portions of the inner dielectric sheet adjacent each reducible metal oxide or nitride sheet may remain after partial removal of dielectric material such that a cross-sectional view of the groove may appear parabolic rather than rectangular or square. Grooves need not be fully cleaned out of all dielectric material to provide the air space to be filled by PMMA-type resist in the next step.

As set forth in FIG. 6, the fabrication process continues with step 604, the filling in of the grooves with a PMMA-type resist material. The PMMA-type resist material, used to fill the grooves, may be selected from polymethylmethacrylate (PMMA), SU-8 (a bisphenol-A Novolac epoxy), poly (methy-2-chloroacrylate), or hydrogen silsesquioxane (HSQ), or other materials usable as sacrificial resist. The material for filling is chosen for its ability to be sacrificed (e.g., washed out) even when covered with a metal deposit layer in later steps of the fabrication method. Step 604 is also known in lithography as "trench filling." Optionally, the step 604 comprising trench filling of the grooves with PMMA-type resist material may be following by another planarization step 606 to level all the exposed end portions of the layers, including the PMMA-type material portions, into coplanarity.

Figure 7C:
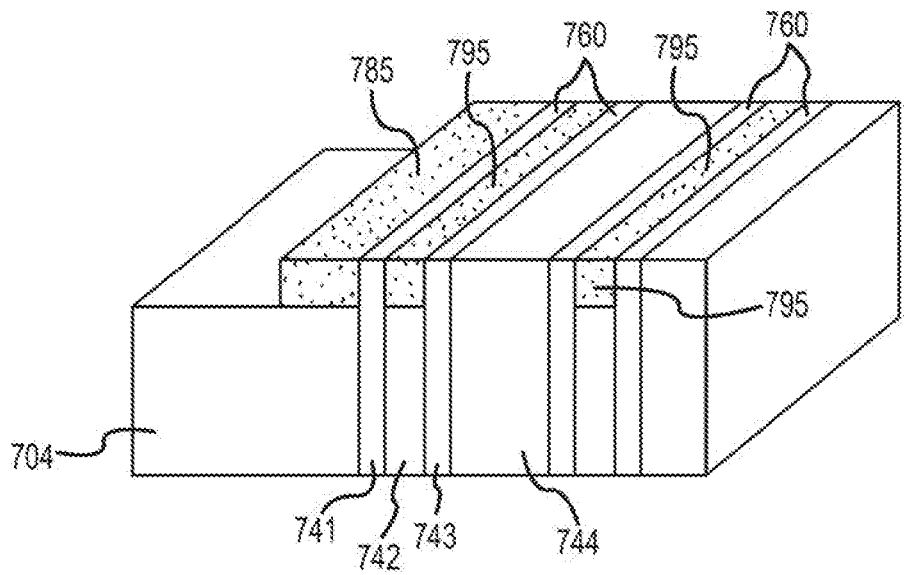

An exemplary structure provided by step 604 in FIG. 6 (and optional second planarization step 606) is illustrated in FIG. 7C. The structure in FIG. 7C comprises portions 785 and 795 of PMMA-type resist material that will filled into the grooves in the inner dielectric sheet layers. Portion 785 is a block of PMMA-type resist material over the protrusion 704 while the portions 795 of PMMA-type resist material are the portions filling the grooves in the inner dielectric sheet layers. The intermediate structure in FIG. 7C further comprises the intact reducible metal oxide or nitride layers 741 and 743, with exposed end portions 760 on the newly planarized top surface of the structure, and the outer dielectric layers 744. In this structure, each of the exposed end portions of the PMMA-type resist, the reducible metal oxide or nitride layers, and the outer dielectric layers, appear as parallel strips on the planarized top surface of the structure. In this structure, the inner dielectric layers cannot be seen on the planarized top surface since they are beneath the PMMA-type resist fill material.

The next step of the fabrication process set forth in FIG. 6 comprises step 608, the deposition of a metal layer across the top surface of the structure, over the top of all of the exposed end portions of the metal oxide or nitride layers, the outer dielectric layers and the PMMA-type resist portions. In certain embodiments, the metal deposited comprises gold (Au). In various aspects, a gold (Au) layer having a thickness of from about 5 nm to about 15 nm may be sputter deposited onto the structure.

Figure 7D:
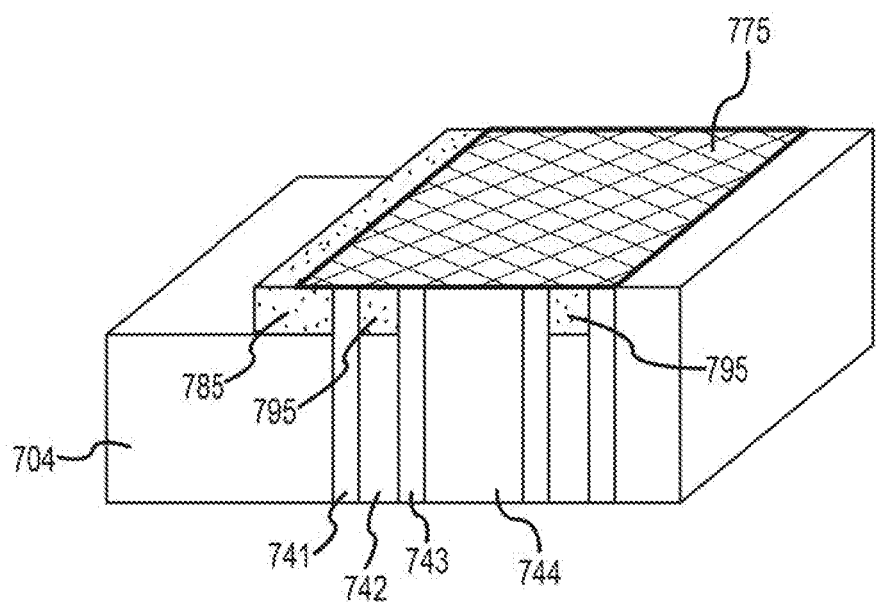

A structure resulting from step 606 of FIG. 6 is illustrated in FIG. 7D. The structure in FIG. 7D comprises a deposited metal layer 775, further comprising, for example, sputter deposited gold (Au) of from about 5 nm to about 15 nm in thickness. The metal layer 775 is shown to cover the PMMA-type resist material portions 795 and the exposed end portions of each of the metal oxide or nitride layers 741 and 743. The inner dielectric layers 742 are shown to reside beneath the PMMA-type resist portions 795. The outer dielectric layers 744 extend up to the planarized surface, now coated with a metal deposit layer 775.

Figure 7E:
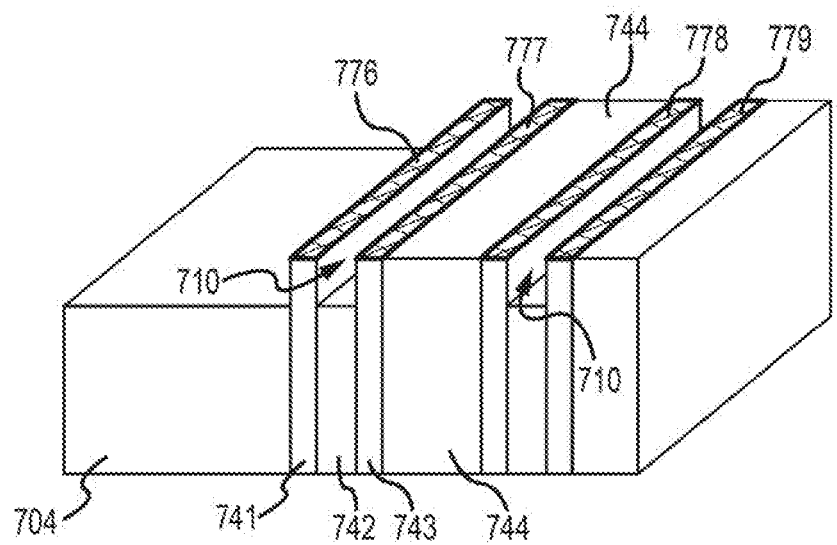

The next step in the metal deposition and selective lift-off process of FIG. 6 is step 610, the removal of the sacrificial PMMA-type resist portions. Washing away of the PMMA-type resist material also removes any metal deposited on top of the PMMA-type resist portions but not deposited metal on the metal oxide or nitride layers. A structure resulting from step 610 of FIG. 6 is illustrated in FIG. 7E. The resulting structure shown comprises parallel strips of metal (e.g., Au) 776, 777, 778 and 779, which can operate as pairs of metal electrodes in sensor devices comprising the structure shown. Each pair of metal strips is separated by an outer dielectric layer 744 as shown. Removal of the PMMA-type resist material is shown to have also restored the grooves 710 that were previously etched into the exposed end portions of the inner dielectric sheet layers and temporarily trench filled with PMMA-type resist material. With these steps in the fabrication process, the reducible metal oxide or nitride layers 741 and 743 need not be reduced to the corresponding base metal because each of these layers are coated with the metal deposit 776, 777, 778 and 779, such as Au. However, if necessary, the structure shown in FIG. 7E may optionally be subjected to reducing conditions (e.g., $H_2$) to reduce the exposed edges of the metal oxide or nitride sheets on a side of the structure and not covered with metal deposits into base metal, such as to provide a conductive route to make various future electrical connections. Further illustrated in this structure is the protrusion 704, now cleaned off of any PMMA-type resist material and metal deposited on the PMMA-type resist material.

The next step in the metal deposition and selective lift-off process of FIG. 6 is step 612, which is the masking of selected regions of the top surface of the structure so that only short segments of deposited metal strips remain exposed for later manipulations. Step 612 of FIG. 6 is identical with step 404 of FIG. 4, and is therefore not detailed again in discussion of FIG. 6.

Figure 7F:
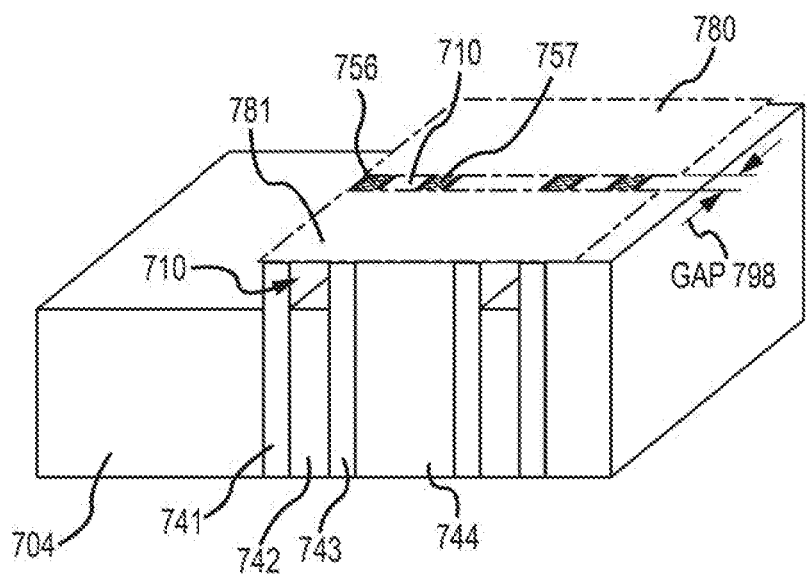

An exemplary structure resulting from the selective masking step 612 of FIG. 6 is illustrated in FIG. 7F. The structure comprises two separate masking layer portions 780 and 781 separated by a spacing designated as GAP 798. As mentioned in the context of FIG. 4 and step 404, the masked regions may be deposited on the top surface substantially perpendicular to the parallel metal strips, such as with the two portions of masking separated by a gap of from about 2 nm to about 40 nm, or from about 5 to about 15 nm for targeted placement of metal islands and/or for controlled attachment of molecules onto the exposed metal electrode strip segments. As mentioned previously herein, the masking need not comprise separate masking layer portions, but may instead comprise a continuous portion with a "window" defining the gap, such as obtained by first laying down a mask line. The exposed portions 756 and 757 of each deposited metal strip, appearing substantially as rectangles of nanoscale proportions, measure, for example, from about 1 nm to about 40 nm, or from about 5 nm to about 15 nm, or from about 2 nm to about 15 nm in width, by about 2 nm to about 40 nm, or from about 5 to about 15 nm in length. In various embodiments, an exposed deposited metal strip segment 756 may measure about 2 nm in width by about 10 nm in length. In other embodiments, the exposed strip segment 756 may measure about 5 nm in width by about 15 nm in length.

These short segments of deposited metal strips then become the targets for metal island deposition, as per step 406 of FIG. 4 (with the option of annealing the deposits for ball-up), or for attachment of molecules, such as bridge molecules that can span across metal portions in each pair. In various embodiments, the deposited islands may comprise a different metal than the metal strip segments onto which they are deposited.

The notable difference between the masked structure in FIGS. 5C/5D and the structure in FIG. 7F is that the structure in FIG. 7F comprises slots 710. These slots 710 are what remain of the grooves selectively etched in the exposed end portions of the inner dielectric sheet layers. The slots run underneath the masked portions 780 and 781, and appear as small holes, one between each pair of exposed metal strip portions 756 and 757. This hole between metal strips facilitates bonding of a molecule between the pair of metal strips, bridging over the hole. Further, the hole improves electrical signaling in molecular sensors by allowing space for an analyte molecule to interact with a bridge molecule bonded to the metal strips.

By limiting the exposed area of the pairs of metal electrode strips to only a gap between dielectric cover layers, it is ordinarily possible to prevent more than one molecule from attaching to the exposed metal in each pair of metal strips. In a sensor application, when more than one molecule is attached to a pair of metal strips connected as source and drain electrodes in a circuit, the readings for the particular circuit are affected. In the case where a current is measured between electrodes in a pair of electrodes through a bridging molecule in a circuit, the attachment of multiple molecules between the electrodes can lower the current measured across the electrodes and lead to undiscernible current measurements. Having only a single molecule per electrode pair improves the accuracy of a sensor device based on these structures. One bridge molecule per pair of metal electrode strips also ensures that analyte molecules only interact with one circuit, wherein the circuit comprises the pair of electrode strips and a single bridge molecule spanning between them.

In various embodiments, various structures disclosed herein are assembled into molecular sensor devices. These structures may be fabricated into large arrays, e.g., as many as 10,000 or at least 10 million structures. From structures such as the structures in FIG. 5D and in FIG. 7F, a plurality of lead conductors are connected to the plurality of electrode strips with each lead conductor connected to a respective electrode sheet. Depending on the fabrication route (FIG. 1 and FIG. 4, or alternatively FIG. 1 and FIG. 6), the electrode strips may comprise metal strips obtained from the reduction of reducible metal oxide or metal nitride, or metal strips obtained from deposition of a metal onto end portions of reducible metal oxide or metal nitride sheets. In various examples, the lead conductors may diverge in width as the lead conductor extends away from an edge of each metal electrode strip toward a contact. The lead conductors can be made of a conductive material such as gold for carrying a test signal from the electrode strips. The lead conductors may then fan out from a width of approximately 10 nm to a scale of micrometers to allow for soldering at the contacts. The contacts can include a contact pad array for circuit packaging, solder bonding, or wire bonding.

In some implementations, a gate electrode is optionally deposited parallel to the substrate plane and perpendicular to a reducible metal oxide or metal nitride plane defined by a reducible metal oxide or metal nitride sheet. The gate electrode can include, for example, a Si or metallic electrode placed on a side of the substrate opposite the reducible metal oxide or metal nitride sheets or near a front portion of the reducible metal oxide or metal nitride sheets on the same side of the substrate as the reducible metal oxide or metal nitride sheets. Addition of an electrode gate can ordinarily improve the accuracy of readings from the pairs of electrode strips by imposing an electric field to regulate the charge carriers between the first electrode strip and the second electrode strip serving as source and drain electrodes in a pair of electrodes. An electrode gate can be especially useful in implementations where the electrodes include a semiconductor.

The foregoing description of the disclosed example embodiments is provided to enable any person of ordinary skill in the art to make or use the embodiments in the present disclosure. Various modifications to these examples will be readily apparent to those of ordinary skill in the art, and the principles disclosed herein may be applied to other examples without departing from the present disclosure. The described embodiments are to be considered in all respects only as illustrative and not restrictive, and the scope of the disclosure is therefore indicated by the following claims rather than by the foregoing description. All changes which come within the meaning and range of equivalency of the claims are to be embraced within their scope.

The invention claimed is:

1. A method of manufacturing a structure usable in a molecular sensor device, the method comprising:
   providing a substrate defining a substrate plane with a protrusion protruding from the substrate at an angle to the substrate plane;
   depositing a first reducible metal oxide or metal nitride layer in an orientation along a side of the protrusion to form a first reducible metal oxide or metal nitride sheet at the angle to the substrate plane;
   depositing an inner dielectric layer on the first reducible metal oxide or metal nitride layer to form an inner dielectric sheet at the angle to the substrate plane;
   depositing a second reducible metal oxide or metal nitride layer on the inner dielectric layer to form a second reducible metal oxide or metal nitride sheet at the angle to the substrate plane, wherein the first reducible metal oxide or metal nitride sheet and the second reducible metal oxide or metal nitride sheet form a pair of sheets spaced apart by the inner dielectric sheet between the first reducible metal oxide or metal nitride sheet and the second reducible metal oxide or metal nitride sheet;
   depositing an outer dielectric layer on the second reducible metal oxide or metal nitride layer to form an outer dielectric sheet at an angle to the substrate plane;

repeating the depositing of the first reducible metal oxide or metal nitride layer, the inner dielectric layer, the second reducible metal oxide or metal nitride layer, and the outer dielectric layer at least once to form spaced apart pairs of reducible metal oxide or metal nitride sheets with an inner dielectric sheet between each reducible metal oxide or metal nitride sheet in the pair of reducible metal oxide or metal nitride sheets and an outer dielectric sheet between each pair of reducible metal oxide or metal nitride sheets;

planarizing the pairs of reducible metal oxide or metal nitride sheets, the inner dielectric sheets, and the outer dielectric sheets to form exposed end portions of each; and reducing the exposed end portions of the reducible metal oxide or metal nitride sheets to the corresponding metal to form parallel metal electrode strips.

2. The method of claim 1, wherein each inner dielectric layer is deposited with a first thickness and each outer dielectric sheet is deposited with a second thickness at least one order of magnitude greater than the first thickness.

3. The method of claim 1, further comprising attaching a mechanically supportive block material adjacent a stack formed by the deposited first reducible metal oxide or metal nitride layers, inner dielectric layers, second reducible metal oxide or metal nitride layers, and outer dielectric layers, prior to the step of planarizing.

4. The method of claim 1, wherein the inner dielectric sheets and the outer dielectric sheets comprise different dielectric materials.

5. The method of claim 1, wherein reducing the exposed end portions of the reducible metal oxide or metal nitride sheets to the corresponding metal comprises exposure to $H_2$.

6. The method of claim 1, further comprising placing at least one portion of a dielectric mask layer across the metal electrode strips to leave short segments of electrode strips exposed in a gap and depositing metal islands on the short segments of electrode strips.

7. The method of claim 5, wherein the gap measures from about 2 nm to about 40 nm.

8. The method of claim 1, further comprising connecting a plurality of lead conductors to metal electrode strips with each lead conductor connected to a respective electrode strip, wherein each lead conductor diverges in width as the lead conductor extends away from an edge of the electrode strip.

9. The method of claim 1, further comprising depositing a gate electrode parallel to the substrate plane and perpendicular to a reducible metal oxide or metal nitride plane defined by a reducible metal oxide or metal nitride sheet in the spaced apart pairs of reducible metal oxide or metal nitride sheets.

10. A method of manufacturing a structure usable in a molecular sensor device, the method comprising:

providing a substrate defining a substrate plane with a protrusion protruding from the substrate at an angle to the substrate plane;

depositing a first reducible metal oxide or metal nitride layer in an orientation along a side of the protrusion to form a first reducible metal oxide or metal nitride sheet at the angle to the substrate plane;

depositing an inner dielectric layer on the first reducible metal oxide or metal nitride layer to form an inner dielectric sheet at the angle to the substrate plane;

depositing a second reducible metal oxide or metal nitride layer on the inner dielectric layer to form a second reducible metal oxide or metal nitride sheet at the angle to the substrate plane, wherein the first reducible metal oxide or metal nitride sheet and the second reducible metal oxide or metal nitride sheet form a pair of sheets spaced apart by the inner dielectric sheet between the first reducible metal oxide or metal nitride sheet and the second reducible metal oxide or metal nitride sheet;

depositing an outer dielectric layer on the second reducible metal oxide or metal nitride layer to form an outer dielectric sheet at an angle to the substrate plane;

repeating the depositing of the first reducible metal oxide or metal nitride layer, the inner dielectric layer, the second reducible metal oxide or metal nitride layer, and the outer dielectric layer at least once to form spaced apart pairs of reducible metal oxide or metal nitride sheets with an inner dielectric sheet between each reducible metal oxide or metal nitride sheet in the pair of reducible metal oxide or metal nitride sheets and an outer dielectric sheet between each pair of reducible metal oxide or metal nitride sheets;

planarizing the pairs of reducible metal oxide or metal nitride sheets, the inner dielectric sheets, and the outer dielectric sheets to form exposed end portions of each;

selectively etching an exposed end portion of each inner dielectric sheet to form grooves in each inner dielectric sheet descending from the planarized edge toward the substrate;

filling the grooves with PMMA-type resist material;

depositing a metal layer on the planarized surface of the structure; and removing the PMMA-type resist material along with deposited metal residing thereon leaving an arrangement of pairs of spaced apart parallel metal electrode strips with the metal electrode strips in a pair of strips separated by a groove.

11. The method of claim 10, further comprising attaching a mechanically supportive block material adjacent a stack formed by the deposited first reducible metal oxide or metal nitride layers, inner dielectric layers, second reducible metal oxide or metal nitride layers, and outer dielectric layers, prior to the step of planarizing.

12. The method of claim 10, wherein the inner dielectric sheets and the outer dielectric sheets comprise different dielectric materials.

13. The method of claim 10, wherein the inner dielectric layer has a first thickness and the outer dielectric layer has a second thickness at least one order of magnitude greater than the first thickness.

14. The method of claim 10, further comprising placing at least one portion of a dielectric mask layer across the metal electrode strips to leave short segments of electrode strips exposed in a gap and depositing metal islands on the short segments of electrode strips.

15. The method of claim 14, wherein the gap measures from about 2 nm to about 40 nm.

16. A structure usable in a molecular sensor device, said structure comprising:

a substrate defining a substrate plane;

spaced apart pairs of reducible metal oxide or metal nitride layer sheets attached on an edge of the reducible metal oxide or metal nitride layer sheet to the substrate at an angle to the substrate plane;

an inner dielectric sheet disposed between the reducible metal oxide or metal nitride layer sheets in each pair of reducible metal oxide or metal nitride layer sheets; and an outer dielectric sheet disposed between spaced apart pairs of reducible metal oxide or metal nitride layer sheets, wherein an edge of each reducible metal oxide or metal nitride layer sheet, inner dielectric sheet and outer dielectric sheet opposite the substrate are coplanar.

17. The structure of claim 16, wherein each inner dielectric sheet has a first thickness and each outer dielectric sheet has a second thickness at least one order of magnitude greater than the first thickness.

18. The structure of claim 16, wherein the inner dielectric sheets and the outer dielectric sheets comprise different dielectric materials.

19. The structure of claim 16, further comprising a groove located on an exposed end portion of each inner dielectric sheet opposite the substrate.

20. The structure of claim 16, further comprising metal on the edge of each reducible metal oxide or metal nitride layer sheet that are coplanar to the edges of inner dielectric sheet and outer dielectric sheet opposite the substrate.

\* \* \* \* \*